United States Patent
Sutardja et al.

(10) Patent No.: US 6,844,837 B1
(45) Date of Patent: *Jan. 18, 2005

(54) CLASS B DRIVER

(75) Inventors: Sehat Sutardja, Cupertino, CA (US); Pierte Roo, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 10/191,924

(22) Filed: Jul. 8, 2002

Related U.S. Application Data

(63) Continuation-in-part of application No. 09/920,241, filed on Aug. 1, 2001, and a continuation-in-part of application No. 09/737,474, filed on Dec. 18, 2000, now Pat. No. 6,462,688.

(51) Int. Cl.[7] .............................................. H03M 1/66
(52) U.S. Cl. ..................... 341/144; 341/153; 375/296
(58) Field of Search ............................. 341/143, 153, 341/144; 375/296, 297; 333/165, 166

(56) References Cited

U.S. PATENT DOCUMENTS

| | | | |
|---|---|---|---|
| 3,543,009 A | 11/1970 | Voelcker, Jr. | |
| 4,112,253 A | 9/1978 | Wilhelm | |
| 4,152,541 A | 5/1979 | Yuen | |
| RE30,111 E | 10/1979 | Blood, Jr. | |
| 4,393,494 A | 7/1983 | Belforte et al. | |
| 4,947,171 A | 8/1990 | Pfeifer et al. | |
| 5,307,405 A | 4/1994 | Sih | |
| 5,388,092 A | 2/1995 | Koyama et al. | |
| 5,418,478 A * | 5/1995 | Van Brunt et al. | 326/86 |
| 5,517,435 A | 5/1996 | Sugiyama | |
| 5,539,773 A | 7/1996 | Knee et al. | |
| 5,625,357 A | 4/1997 | Cabler | |
| 5,651,029 A * | 7/1997 | Yang et al. | 375/296 |
| 5,659,609 A | 8/1997 | Koizumi et al. | |
| 5,663,728 A | 9/1997 | Essenwanger | |
| 5,666,354 A | 9/1997 | Cecchi et al. | |
| 5,796,725 A | 8/1998 | Muraoka | |
| 5,822,426 A | 10/1998 | Rasmus et al. | |
| 5,825,819 A | 10/1998 | Cogburn | |
| 5,864,587 A | 1/1999 | Hunt | |
| 5,936,450 A | 8/1999 | Unger | |
| 6,067,327 A * | 5/2000 | Creigh et al. | 375/295 |
| 6,172,634 B1 | 1/2001 | Leonowich et al. | |
| 6,249,164 B1 * | 6/2001 | Cranford et al. | 327/270 |
| 6,332,004 B1 * | 12/2001 | Chan | 375/257 |
| RE37,619 E | 4/2002 | Mercer et al. | |
| 6,570,931 B1 * | 5/2003 | Song | 375/295 |
| 2001/0050585 A1 | 12/2001 | Carr | |

FOREIGN PATENT DOCUMENTS

WO    WO 99/46867    9/1999

OTHER PUBLICATIONS

"Gigabit Ethernet 1000BASE–T," Gigabit Ethernet Alliance, copyright 1997.
Sedra et al. "Operational Amplifiers," Chapter 2 Section §2.4 In Microelectronic Circuits. Third Edition, 1991, pp. 61–63.

* cited by examiner

Primary Examiner—Howard Williams

(57) ABSTRACT

A communication circuit, Ethernet controller card, and method comprises K digital-to-analog converters each receiving a corresponding digital control signal and each providing a corresponding analog control signal, wherein K is at least two; K voltage-to-current converters each providing a corresponding bi-level transmit signal component in accordance with a respective one of the corresponding analog control signals; and wherein the corresponding bi-level transmit signal components of each of the K voltage-to-current converters are combined to produce a J-level transmit signal, wherein J=K+1.

156 Claims, 19 Drawing Sheets

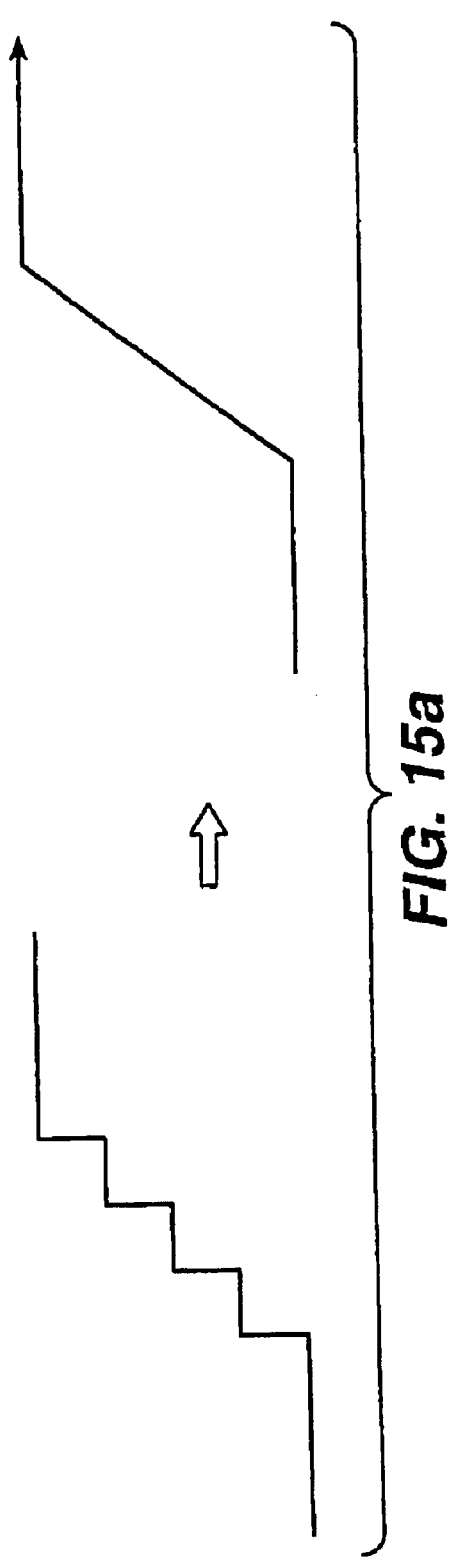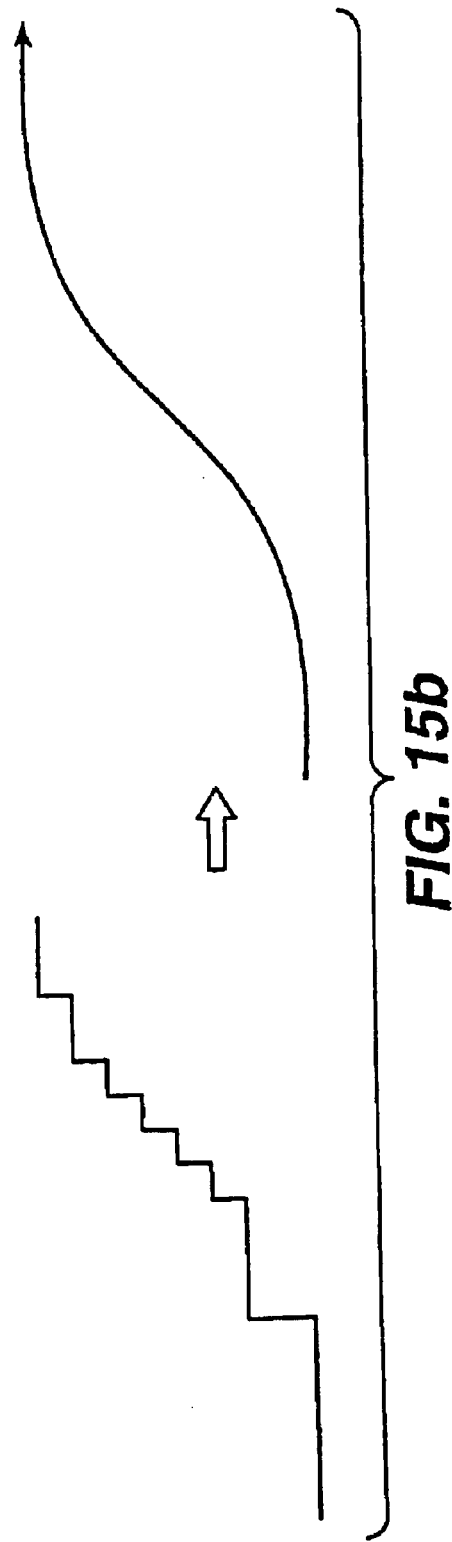

CLASS B DRIVER

CROSS-REFERENCE TO RELATED APPLICATIONS

This application is a continuation-in-part of U.S. Non-Provisional patent application Ser. No. 09/920,241 entitled "Apparatus And Method For Converting Single-Ended Signals To A Differential Signal, And A Transceiver Employing Same," filed Aug. 1, 2001; and U.S. Non-Provisional patent application Ser. No. 09/737,474 entitled "Direct Drive Programmable Class A and B High Speed Power Digital-To-Analog Converter," filed Dec. 18, 2000 (now U.S. Pat. No. 6,462,688), the disclosures thereof incorporated by reference herein in their entirety.

BACKGROUND

The present invention relates generally to data communication. More particularly, the present invention relates to a Class B line driver for communication channels such as those present in an Ethernet network.

Digital-to-analog conversion involves the process of converting digital codes into a continuous range of analog signal levels (voltage or current), for example, as discussed in Chapter 31, "D/A and A/D Converters" of The Electrical Engineering Handbook, ed. Richard C. Dorf, CRC Press 1993, the contents of which are hereby incorporated by reference. A digital-to-analog converter (hereinafter a DAC) is generally an electronic circuit that receives an n-bit codeword from an interface and generates an analog voltage or current that is proportional to the codeword.

One example of a DAC is discussed in U.S. Pat. No. 5,663,728, entitled A Digital-To-Analog Converter (DAC) and Method that set Waveform Rise and Fall Times to Produce an Analog Waveform that Approximates a Piece-wise Linear Waveform to Reduce Spectral Distortion, issued on Sep. 2, 1997, the contents of which are hereby incorporated by reference. The DAC of the U.S. Pat. No. 5,663,728 patent employs a waveform shaping circuit to control the rise and fall times of each component waveform so that the analog waveform rising and falling edges settle to within a desired error bound of a linear output ramp.

U.S. Pat. No. 5,936,450, entitled A Waveshaping Circuit Using Digitally Controlled Weighted Current Summing, issued on Aug. 10, 1999, the contents of which are hereby incorporated by reference, discloses a waveshaping circuit. The waveshaping circuit of the U.S. Pat. No. 5,936,450 patent includes a controller and a current summing circuit controlled by the controller. The current summing circuitry selectively sinks combinations of component currents in response to a sequence of control signal sets to generate an output current signal having a desired waveform.

Many DACs attempt to generate desired signal waveform in response to a digital signal. For the purposes of this discussion, a signal output may include the output of a DAC and/or the output of one or more signal components within a DAC. For example, a signal component may correspond to an individual bit of a codeword. One conventional method generates a signal output with a slew rate controlled current source, as shown in FIG. 1. The voltage V measured across a resistor R is shown in FIG. 2. The waveform V includes sharp transition areas (e.g., corners) 1, 2 and 3, which may introduce electromagnetic interference. Such interference may inhibit accurate signal processing.

Another circuit which generates an output signal employs a current mirror 10 having an RC filter, as illustrated in FIG. 3. A current source I drives the current mirror 10. Current mirror 10 includes a first transistor 11 and a second transistor 12. Transistors 11 and 12 are preferably CMOS transistors. The first transistor 11 includes gate-to-drain feedback, and is coupled to transistors 12 through the RC filter. The RC filter limits rise and fall times of the input signal I. However, the R and C components are typically process and/or temperature dependent. Such dependence causes variation in the output waveform as shown in FIG. 4. The dashed lines in FIG. 4 represent arbitrary output responses due to temperature and/or process variation. A stable output signal is difficult to obtain with such a circuit.

Many older communications technologies employ bi-level signals, where each signal can have one of only two levels. However, newer communications technologies employ signals having many levels. One such technology, Gigabit Ethernet, employs signals having 17 levels. FIG. 5 depicts a D/A circuit capable of producing such multi-level signals. The D/A circuit of FIG. 5 employs a DAC 32, a low pass filter 34, an operational amplifier 36, a transistor 38, and a resistor 39. Each level of a multilevel input signal is provided to DAC 32 for conversion to an analog signal. The LPF34 then determines the rise time of the output of the DAC 32, and the output is passed to operational amplifier 36. This construction presents two problems. First, the R and C values of LPF 34 will vary with temperature and process variations, and the output signal will have a poor waveshape where the rise times are not constant. Second, since all input current is passed through the same DAC, and since band-width is a function of current level, each level of the multilevel signal will present a different rise time. This second problem is illustrated in FIG. 24.

FIG. 24 shows a waveform produced by the D/A circuit of FIG. 5 where DAC 32 has four levels. Because the bandwidth of the circuit is a function of the signal level provided to the non-inverting input of operational amplifier 36, the slew rate differs for each signal level. Referring to FIG. 24 for example, the bandwidth for the transition from the 0 signal level to the 1 signal level is low, resulting in a low slew rate and a long rise time $t_1$. In contrast, the bandwidth for the transition from the 2 signal level to the 3 signal level is high, resulting in a high slew rate and a short rise time $t_2$.

These signal processing problems are not adequately addressed in the art. Accordingly, there is a need for a current source to control an output signal which is independent of temperature and process considerations. There is also a need for a DAC to generate a signal having selectable transition areas (corners). There is a further need of a circuit to generate desirable waveshapes.

SUMMARY

In general, in one aspect, the invention features a communication circuit, Ethernet controller card, and method. It comprises a digital-to-analog converter to receive a digital control signal, and to provide an analog control signal, the digital-to-analog converter comprising N current sources configured in a parallel arrangement, wherein N is at least two, and wherein each of the N current sources includes a respective control input, M delay elements, an mth one of the M delay elements including an input in communication with an m−1th one of the M delay elements, wherein M is equal to N−1, wherein an output of the mth one of the M delay elements is arranged in communication with the control input of an m+1th one of the N current sources, wherein an input of a first one of the M delay elements receives the digital control signal, and wherein the analog control signal comprises the sum of the outputs of the N current sources; and a voltage-to-current converter to provide a transmit signal based on the analog control signal.

Particular implementations can include one or more of the following features. The M delay elements comprise at least one delay lock loop. The transmit signal is a Class B signal. Implementations can comprise a low-pass filter to receive the analog control signal, and to provide a filtered analog control signal to the voltage-to-current converter. The low-pass filter can comprise a single-pole filter. The voltage-to-current converter provides a replica of the transmit signal. Implementations can comprise a first sub-circuit having a composite input to receive a differential composite signal comprising the transmit signal, a replica input to receive a differential replica signal comprising the replica of the transmit signal, and a difference output to provide a differential difference signal representing a difference between the differential composite signal and the differential replica signal; a second sub-circuit which produces first and second single-ended replica signals which together substantially comprise the differential replica signal; and a third sub-circuit, which is coupled to the first and second sub-circuits, and which produces the differential replica signal from the first and second single-ended replica signals. The voltage-to-current converter comprises a voltage buffer. The communication circuit operates at up to gigabit speeds.

In general, in one aspect, the invention features a communication circuit, Ethernet controller card, and method. It comprises K digital-to-analog converters each receiving a corresponding digital control signal and each providing a corresponding analog control signal, wherein K is at least two; K voltage-to-current converters each providing a corresponding bi-level transmit signal component in accordance with a respective one of the corresponding analog control signals; and wherein the corresponding bi-level transmit signal components of each of the K voltage-to-current converters are combined to produce a J-level transmit signal, wherein J=K+1.

Particular implementations can include one or more of the following features. The J-level transmit signal is a Class B signal. Each of the K digital-to-analog converters comprises N current sources configured in a parallel arrangement, wherein N is at least two, and wherein each of the N current sources includes a respective control input; M delay elements, an mth one of the M delay elements including an input in communication with an m−1th one of the M delay elements, wherein M is equal to N−1, wherein an output of the mth one of the M delay elements is arranged in communication with the control input of an m+1th one of the N current sources, wherein an input of a first one of the M delay elements receives the corresponding digital control signal. The M delay elements comprise at least one delay lock loop. The K voltage-to-current converters provide a replica of the J-level transmit signal. The replica of the transmit signal comprises first and second single-ended replica signals, further comprising a first sub-circuit which produces a differential replica signal from the first and second single-ended replica signals; and a second sub-circuit coupled to the first sub-circuit and the voltage-to current converters and having a composite input to receive a differential composite signal comprising the transmit signal, a replica input to receive the differential replica signal, and a difference output to provide a differential difference signal representing a difference between the differential composite signal and the differential replica signal. Each of the K voltage-to-current converters comprises a voltage buffer. The communication circuit operates at up to gigabit speeds.

In general, in one aspect, the invention features a communication circuit, Ethernet controller card, and method. It comprises K digital-to-analog converters each receiving a corresponding digital control signal and each providing a corresponding transmit signal component, wherein K is at least two, and wherein at least one each of the K digital-to-analog converters comprises N current sources configured in a parallel arrangement, wherein N is at least two, and wherein each of the N current sources includes a respective control input, M delay elements, an mth one of the M delay elements including an input in communication with an m−1th one of the M delay elements, wherein M is equal to N−1, wherein an output of the mth one of the M delay elements is arranged in communication with the control input of an m+1th one of the N current sources, wherein an input of a first one of the M delay elements receives the corresponding digital control signal, and wherein the corresponding transmit signal component comprises the sum of the outputs of the N current sources; and wherein the corresponding transmit signal components of each of the K digital-to-analog converters are combined to produce a J-level transmit signal, wherein J=K+1.

Particular implementations can include one or more of the following features. The M delay elements comprise at least one delay lock loop. The J-level transmit signal is a Class B signal. Implementations can comprise L digital-to-analog converters each receiving the corresponding digital control signal and each providing a corresponding replica transmit signal component, wherein L=K; and wherein the corresponding further replica transmit signal components of each of the L digital-to-analog converters are combined to produce a J-level replica transmit signal. The communication circuit operates at up to gigabit speeds.

The details of one or more implementations are set forth in the accompanying drawings and the description below. Other features will be apparent from the description and drawings, and from the claims.

DESCRIPTION OF DRAWINGS

FIG. 15a is a graphical depiction of a waveform generated with uniform delay elements.

FIG. 15b is a graphical depiction of a waveform generated with non-uniform delay elements.

DETAILED DESCRIPTION

The present invention will be described with respect to circuits and methods for shaping waveforms, and in particular, to a digital-to-analog converter (DAC) employing such a waveshaping circuit. However, as will be appreciated by those skilled in the art, the present invention is not limited to applications involving DACs, but also may be applied to other applications, such as signal processing, systems to control signal rise/fall time, signal storage, communications, etc. Moreover, while the present invention is particularly suited to applications in the read channel of a hard disk drive, many other applications will suggest themselves to persons of skill in the electrical engineering arts. Furthermore, the present invention is particularly suitable for use with the structure described in U.S. patent application Ser. No. 09/737,743;

entitled "Active Replica Transformer Hybrid", filed concurrently herewith, the contents of which are incorporated herein by reference.

Figure 6:
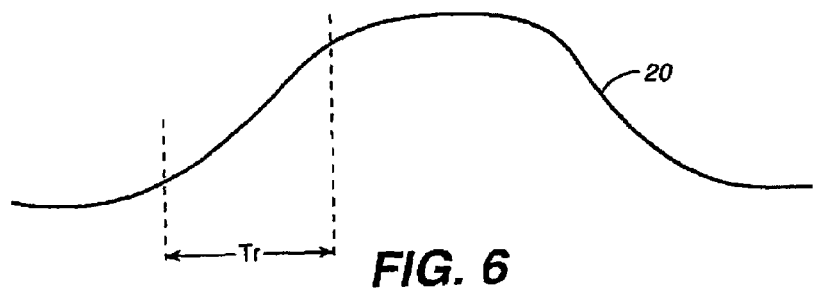
FIG. 6 is a graphical depiction of a waveshape having smooth transition areas.

FIG. 6 illustrates a desired signal output 20. The output waveform 20 includes smooth transition areas, which reduce noise such as electromagnetic interference. A preferred rise time ("$T_r$") for a DAC is 3–5 nanoseconds (ns).

Figure 7:
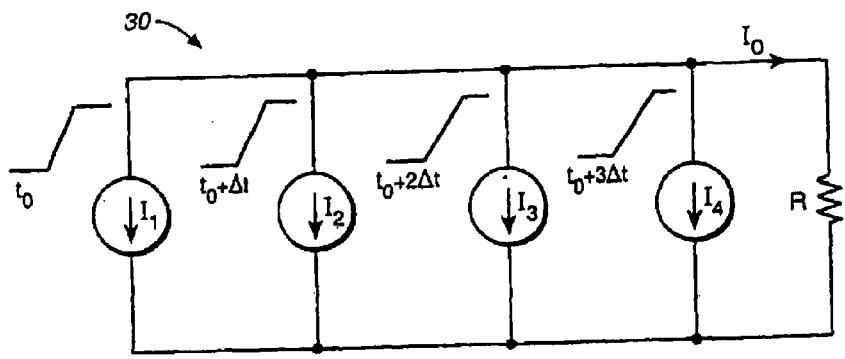
FIG. 7 is a circuit diagram of a current source according to the present invention.
Figure 8:
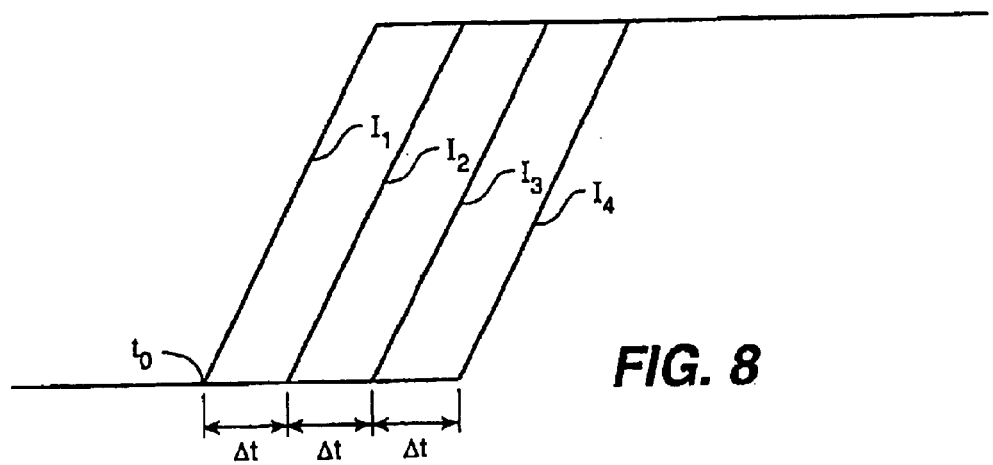
FIG. 8 is a graphical depiction of current components of the current source illustrated in FIG. 6.

The present invention generates a signal to approximate the desired signal output 20 with a current source 30. As shown in FIG. 7, current source 30 includes a plurality of current sources. For example, current source 30 may include current sources $I_1$, $I_2$, $I_3$ and $I_4$. Current sources $I_1$, $I_2$, $I_3$ and $I_4$ each preferably generate a respective current $I_n$, where n is 1, 2, 3 or so forth. The signals $I_n$ are preferably equal in magnitude and form, and may include a signal delay. In the FIG. 7 example, current sources $I_n$ each generate a linear ramp. For example, consider a signal I1, which includes a linearly rising edge starting at time t0. Current I2 mirrors current I1, except that I2 includes a linearly rising edge starting at time t0+Δt. The variable Δt represents an amount of delay time. Current I3 mirrors currents I1 and I2, except that current I3 includes a linearly rising edge starting at time t0+2Δt. Similarly, current I4 mirrors currents I1, I2, and I3, except that its linearly rising edge starts at time t0+3Δt. The relative waveform components for currents $I_1$, $I_2$, $I_3$ and $I_4$ are shown in FIG. 8.

Figure 9:
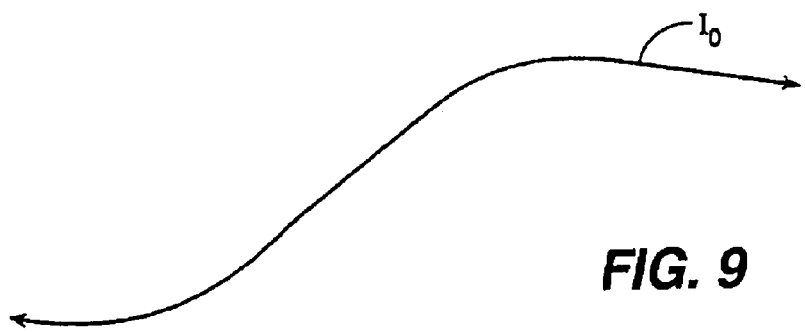
FIG. 9 is a graphical depiction of a resultant output waveshape from the current source illustrated in FIGS. 6 and 7.

Currents $I_1$, $I_2$, $I_3$ and $I_4$ are summed (or mixed) to produce a resultant waveform I0 as shown in FIG. 9. Waveform I0 approximates the desired output signal shown in FIG. 6. Like the desired output signal of FIG. 6, waveform I0 has many desirable properties. For example, I0 has selectable transition areas (corners). The transition areas can be smooth, or sharp, by selectively adjusting the length of Δt. Also, waveform I0 accommodates arbitrary rise/fall times.

Figure 10:
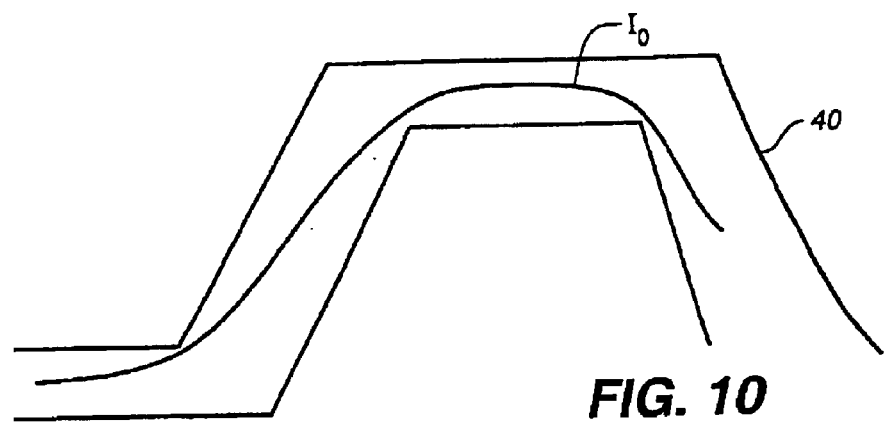
FIG. 10 is a graphical depiction of a waveform template, and a waveshape that fits within the template.

The waveform I0 can also be adjusted by varying Δt to fit within specified requirements. For example, with reference to FIG. 10, waveform I0 can be adjusted to fit within a template 40, for example, as provided by the IEEE standard waveform shape. In this example, I0 has been optimized to produce low electromagnetic interference and to fit within the IEEE template 40.

The delay variable Δt is preferably controlled using a delay-locked loop or is controlled by reference to an external clock. As such, Δt can be precisely regulated. A waveform which is independent of temperature and/or process considerations can then be generated.

The generation of a linear ramp is explained with reference to FIGS. 11–13. A signal is produced from current source 50, which includes a plurality of current sources I1 through In. Each of the plurality of current sources generates a replica signal I. In this example, input signal I is preferably a square waveform. The signal I is delayed by Δt from each subsequent current source, after the initial current source I1. For example, I2 is delayed by Δt, and In is delayed by nΔt. The currents are summed (or mixed) in a known manner to produce an output which approximates a linear ramp.

Figure 12A:
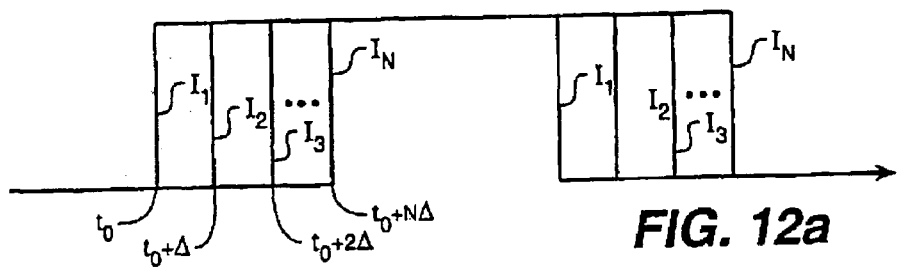
FIGS. 12a–12c are graphical depictions of waveshapes generated by the current source of FIG. 10.
Figure 12B:
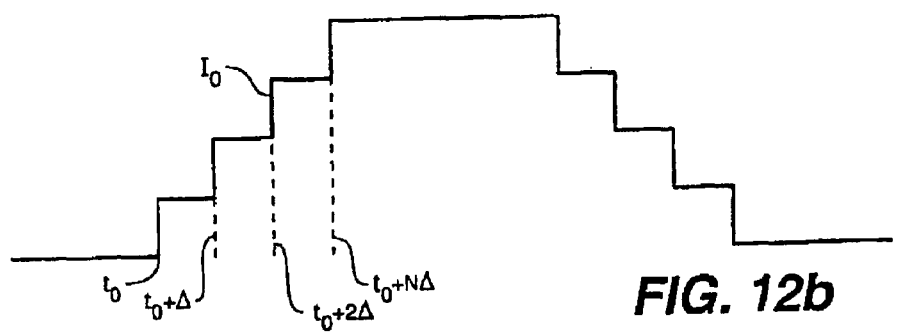
Figure 12C:
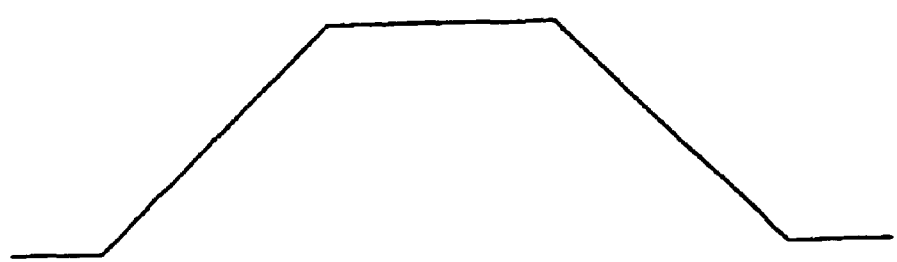

With reference to FIG. 12a, the signal components of the individual current sources are relatively illustrated. FIG. 12b illustrates the resultant waveshape I0, which includes a stair-step pattern. A linear ramp, as shown in FIG. 12c, is approximated as the length of the delay variable Δt is decreased.

Figure 13:
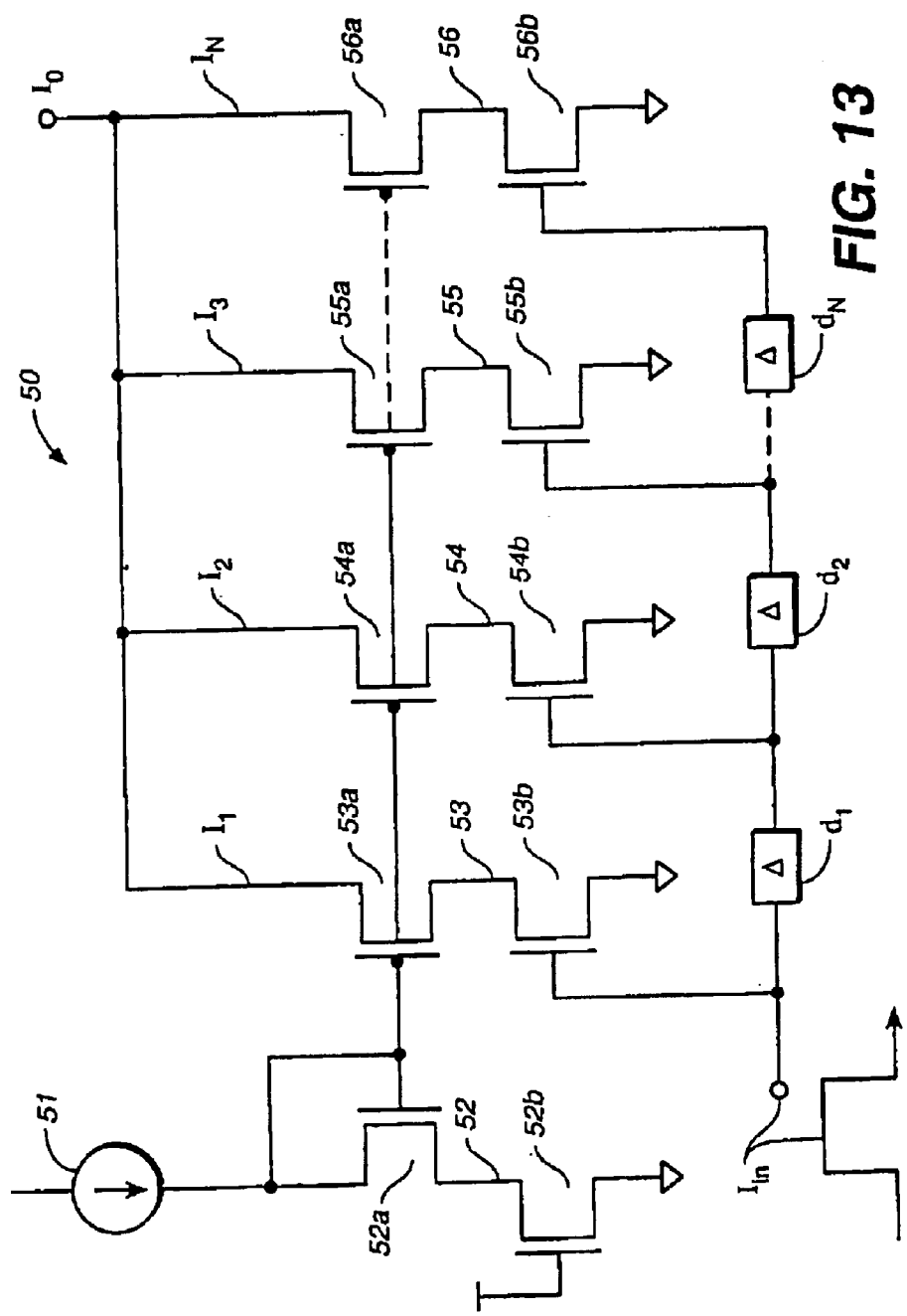
FIG. 13 is a circuit diagram of a current source according to the present invention.

A circuit diagram of the current source 50 is shown in FIG. 13. Current source 50 includes a plurality of transistor pairs 52-56, where pair 56 represents the nth transistor pair. With reference to FIG. 13, a current source 51 drives transistor pair 52. Transistor pair 52 includes a transistor 52a communicating with a transistor 52b. Transistor 52a is preferably configured with gate-to-drain feedback. The gate of transistor 52b is biased so as to operate in an "on" state. The gate/drain of transistor 52a communicates with the gates of transistors 53a, 54a, 55a and 56a. The drains of transistors 53a–56a each communicates with an output to.

The gates of transistors 53b–56b each communicates with an input waveform fin (e.g., a square signal), some through delay elements. For example, the gate of transistor 54b communicates with waveform tin through delay element d1. The gate of transistor 55b communicates with waveform tin through delay element d2 and delay element d1. Similarly, the gate of transistor 56b communicates with waveform Iin through each of the delay elements d1 through dn. In the preferred embodiment, each of delay elements d1–dn delays the signal by Δ. Delay elements can be realized via known delay locked loops.

The operational aspects of FIG. 13 are now even further explained. Initially, waveform Iin is communicated to the gate of transistor 53b, which turns on the transistor pair 53. A signal I1, which is proportional to the waveform Iin, is output at Io. Waveform Iin is also communicated to delay element d1, which delays the waveform by Δ seconds. After Δ seconds, delay element d1 communicates the delayed waveform to the gate of 54b, which turns on the transistor pair 54. A signal I2, which is proportional to Iin, is output at Io. The resultant waveform Io includes the sum (or mixture) of signals I1 and I2. The input waveform Iin is respectively delayed before communicating with the gates of transistors 55b and 56b. Transistor pairs 55 and 56 are activated (e.g., turned on) and respectively supply current I3 and In, which are added to the resultant waveform I. The current source 50, as shown in FIG. 11, is therefore realized.

Figure 1:
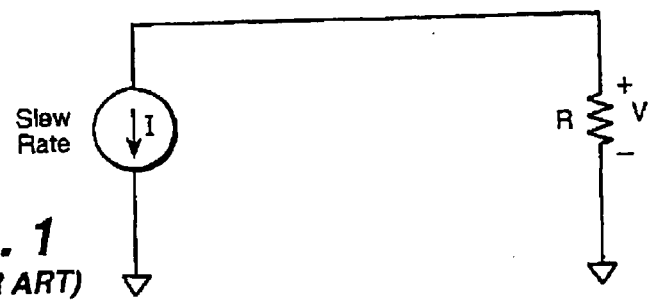
FIG. 1 is a diagram of a conventional circuit, which includes a slew rate controlled current source.
Figure 2:
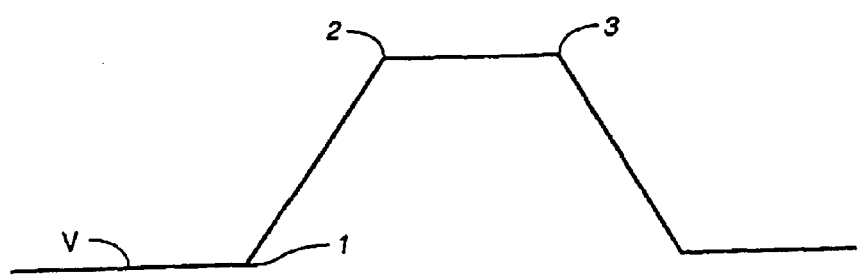
FIG. 2 is a graphical depiction of a waveshape corresponding to an output of the FIG. 1 circuit.
Figure 3:
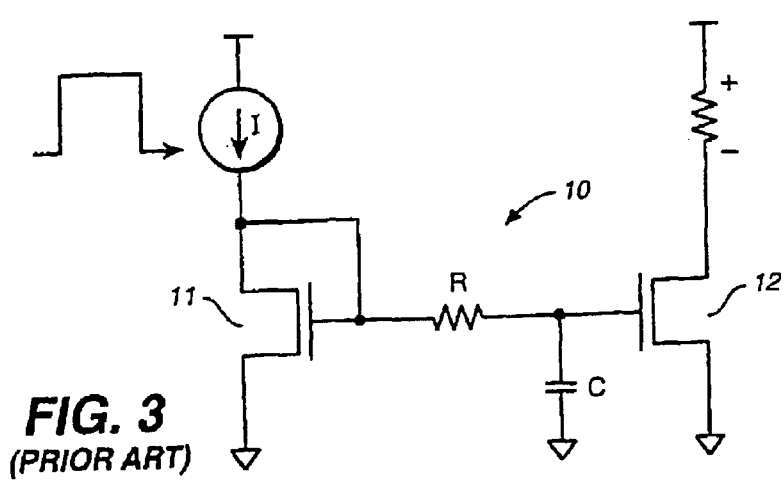
FIG. 3 is a view of a conventional circuit including a current mirror having an RC filter.
Figure 4:
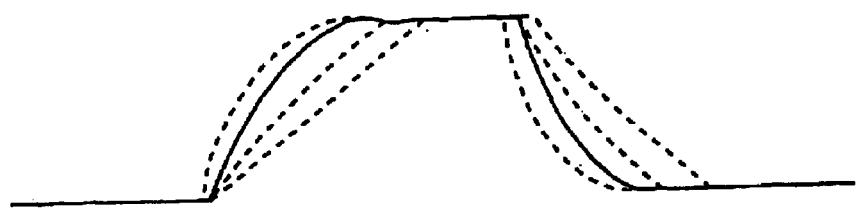
FIG. 4 is a graphical depiction of a waveshape corresponding to an output of the FIG. 3 circuit.
Figure 5:
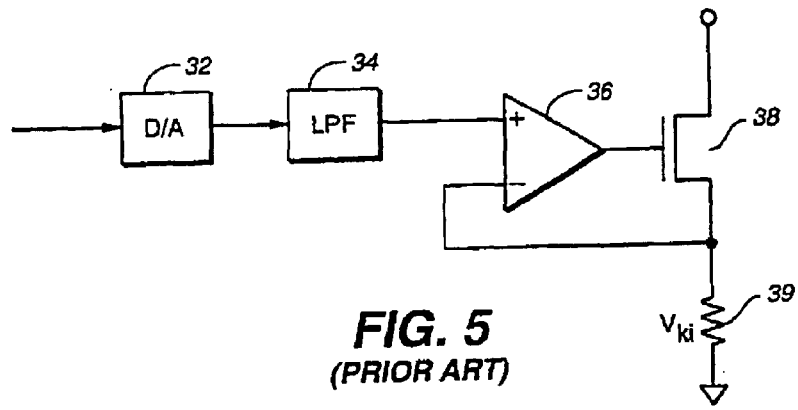
FIG. 5 is a schematic block diagram of a D/A circuit.
Figure 11:
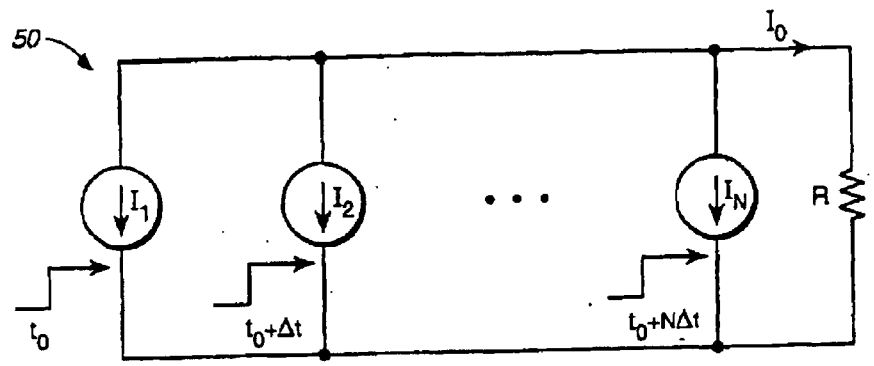
FIG. 11 is a circuit diagram of a current source according to the present invention.

There are many advantages of the configurations shown in FIGS. 11 and 13. For example, individual current sources (e.g., In) can be turned on/off on demand, particularly since Vgs is large and constant. Also, the current source 50 will generally consume less power than the current mirror shown in FIG. 3, particularly since a current mirror typically employs a DC bias. An additional advantage is that with a small Iin, the VGS voltage is also small (e.g., close to the threshold voltage VT). In such a case, VGS-VT-VDS equals a small number of current sources with negative VDS.

Figure 14:
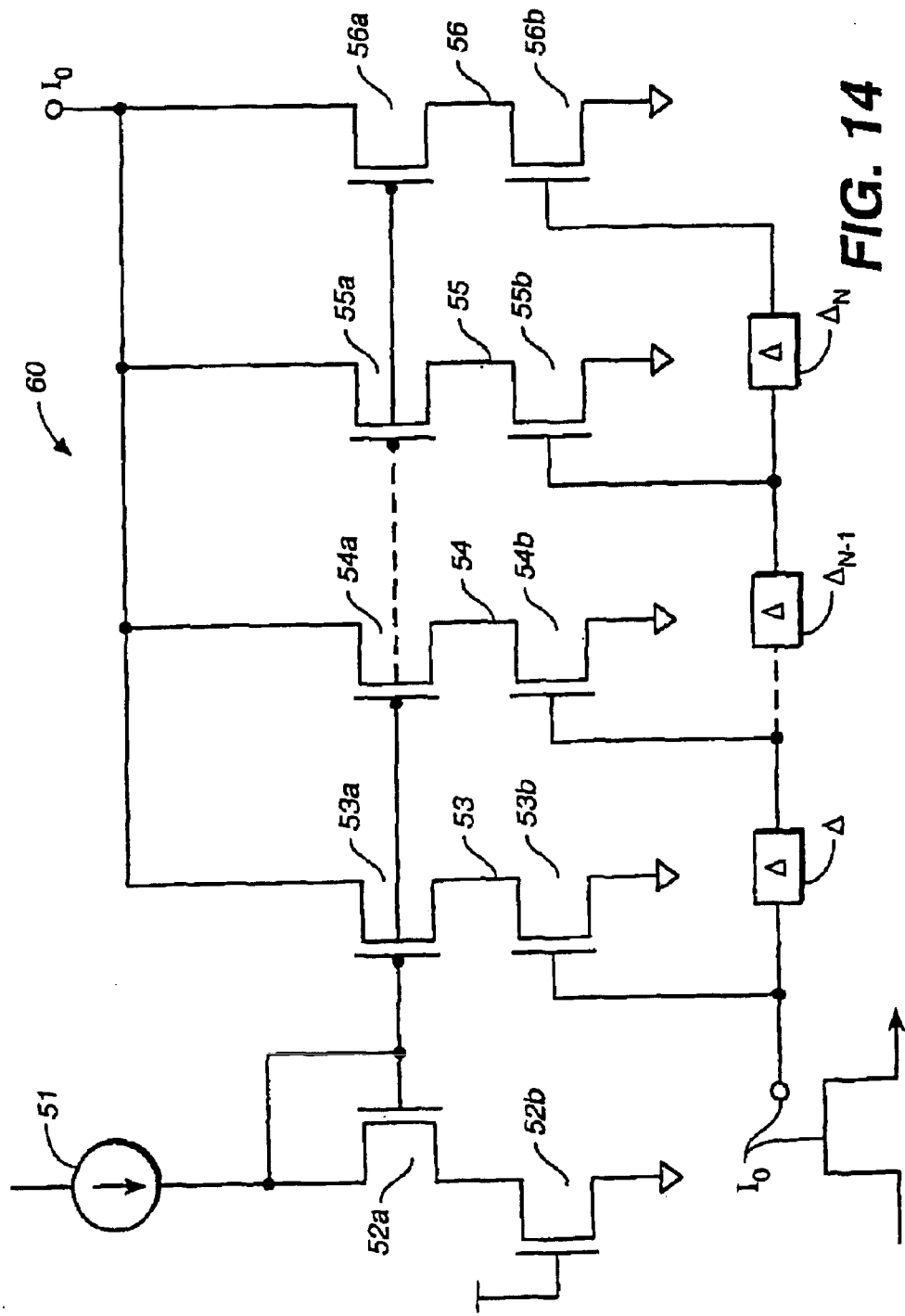
FIG. 14 is a circuit diagram of a current source having variable delay elements according to the present invention.

A further current source 60 is shown in FIG. 14. The current source 60 is configured in the same manner as the current source 50 shown in FIG. 13, except that the delay elements may include variable delays. The same components with respect to FIG. 13 are labeled with their same reference numerals in FIG. 14. In the FIG. 14 embodiment, delay elements Δ are non-uniform throughout the circuit. For example, Δ may involve a longer delay than Δn−1, and so forth. Non-uniform delays may be employed to generate a smooth waveform. Multiple delay-locked-loops are preferably used to achieve different delay times.

To illustrate, an output waveform processed with uniform delay elements is shown in FIG. 15a. Here a stair step waveform is produced, which may approximate a linear ramp, particularly as the variable Δ is decreased in length (e.g., time). In contrast, the amount of delay is varied with respect to individual delay elements as shown in FIG. 15b. The approximated waveshape of FIG. 15b is smooth (e.g., includes smooth transition areas) in comparison to the approximated linear waveshape of FIG. 15b. Eight steps (or corresponding current sources) are employed in a preferred embodiment for a Gigabit channel. Of course, the number of levels may be varied according to need or design without deviating from the scope of the present invention.

Figure 16:
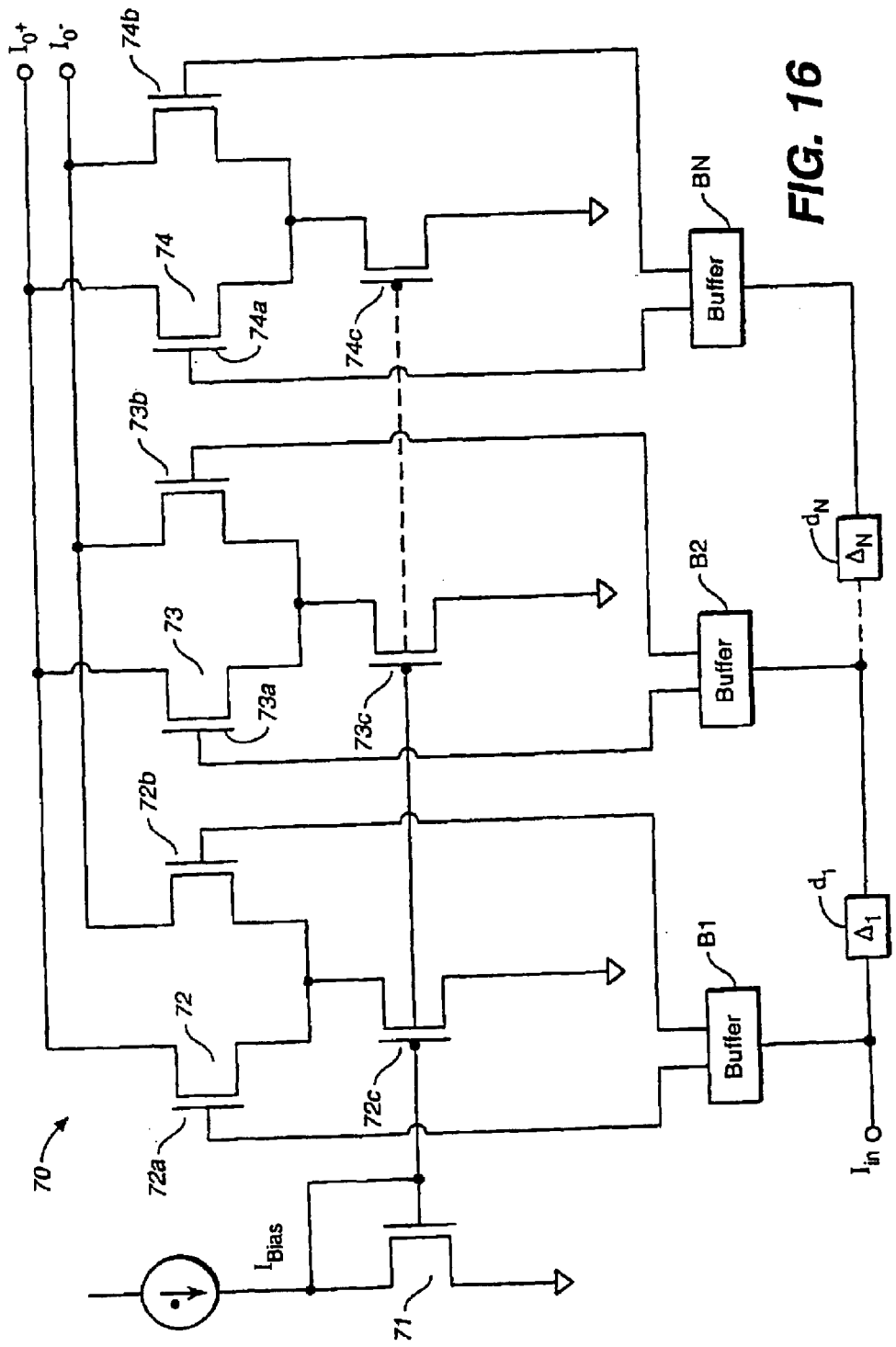
FIG. 16 is a circuit diagram of a current source including a plurality of differential transistor pairs according to the present invention.

A further embodiment of a current source is illustrated in FIG. 16. The illustrated current source 70 includes a plurality of differential transistor pairs 72-74, where 74 represents the nth differential transistor pair. A bias current $I_B$ is supplied to the gate of transistors 72c, 73c and 74c. An input waveform Iin is communicated to the gates of 72a, 72b, 73a, 73b, 74a and 74b. In the case of transistor pair 73 and 74, the input waveform Iin is delayed through delay elements d1 and d1+dn, respectively. Buffers B1–BN are optionally included in the circuit 70 to buffer the input signal Iin. A differential output (Io+, Io−) is accordingly produced.

The advantages of the FIG. 16 current source include constant power dissipation. Also, the circuit provides matching capabilities, for example, for use in an Ethernet channel.

Figure 17:
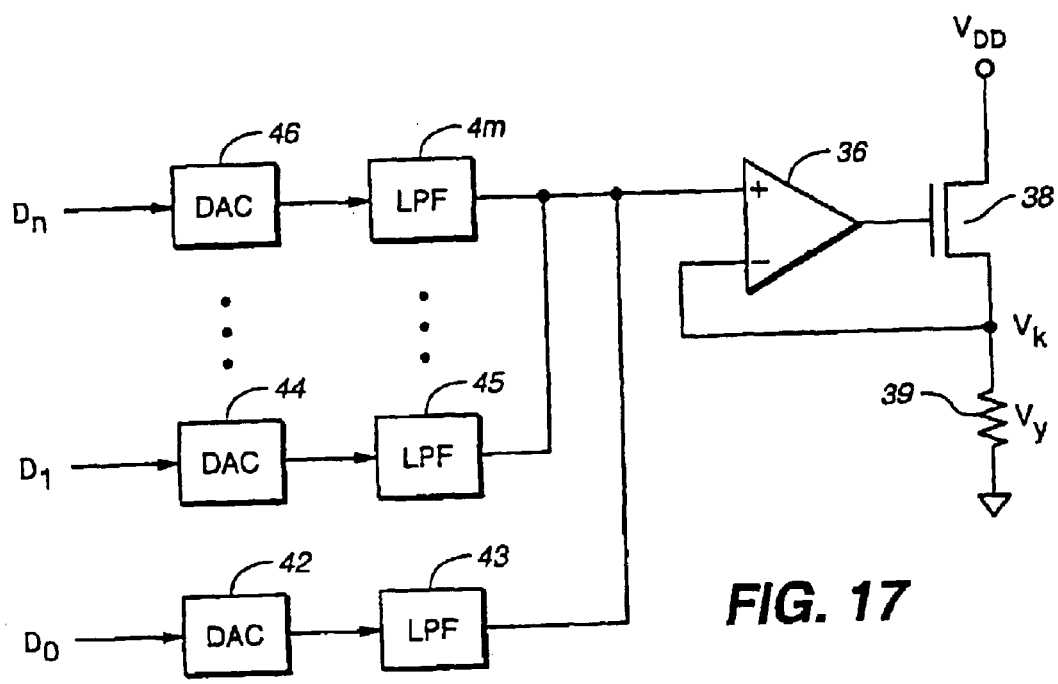
FIG. 17 is a circuit diagram of an alternative embodiment according to the present invention.

One drawback of the differential amplifier in FIG. 16 is that the differential amplifier is a Class A circuit which consumes unnecessary power even when no output is being transmitted. Moreover, a significant number of transistors is required to provide an adequately smoothed output current, thus requiring a large chip area. FIG. 17 depicts a schematic diagram of another embodiment according to the present invention which operates in Class B wherein one DAC is provided for each level of the multilevel input signal. DACs 42, 44, . . . 46 may be provided with corresponding LPFs 43, 45, 4m. Preferably, a circuit according to FIG. 13 supplies each DAC with a control current to provide a stair step output which defines the rise time. In such an embodiment, since each DAC receives control current, and not input current, the transistors which supply each DAC may be smaller than those used in the FIG. 13 embodiment. Additionally, since the control signal determines the rise time of the output of each DAC, the LPFs merely produce a smoother output.

In FIG. 17, multilevel input signal D0, D1, . . . Dn is provided to the parallel DACs 42, 44, . . . 46. The number of DACs may be varied depending on the application. This embodiment solves two problems. First, by providing the FIG. 17 circuit with a staircase waveform, for example, from FIG. 14, an LPF merely smoothes the staircase waveform rather than defines rise time. Second, since the DACs are disposed in parallel, there will be no variations in rise time because each DAC has substantially the same current passing therethrough; that is there will be no bandwidth variation with resultant differences in rise time. The DACs may also be controlled by any appropriate circuitry, such as a decoder disposed prior to the DACs which would, in effect, select which DACs are activated by proper application of the input signals. In an alternative arrangement, a resistor ladder may supply the multilevel signal to the DACs of FIG. 17 rather than the transistors depicted in FIG. 13.

In communication transceivers, and particularly in Ethernet transceivers which are capable of transmitting and receiving data at 1000 megabits bits per second, communication is possible in a full-duplex mode. In other words, transmitting and receiving of data can occur simultaneously on a single communication channel. Implementation of such a full-duplex communication channel results in a composite signal ($V_{TX}$) being present across the output terminals of the transceiver, the composite signal $V_{TX}$ having a differential transmission signal component and a differential receive signal component. In such a communication channel, the received signal ($V_{RCV}$) is derived by simply subtracting the transmitted signal ($V_T$) from the composite signal $V_{TX}$ that is present at the transceiver output terminals. Hence, $V_{RCV}=V_{TX}-V_T$.

This subtraction can be accomplished by generating a signal (referred to as a replica signal) which substantially replicates the transmitted signal, and canceling or subtracting the generated replica signal from the composite signal $V_{TX}$ at the output terminals of the transceiver. However, the replica signal is generated as two single-ended voltages, such as $V_{TXR+}$ and $V_{TXR-}$, whereas the composite signal present at the output terminals of the transceiver is a differential signal. Consequently, in order to cancel the replica signal from the composite signal to thereby obtain the received signal, the two single-ended voltage signals must first be converted to a differential signal that can then be subtracted from the composite signal. This conversion, however, requires additional circuitry which adds to the cost and complexity of the transceiver.

While the present invention will be described with respect to an Ethernet controller for use in general purpose computers, printers, routers, etc. it is to be understood that the present invention may find applicability in other fields such as Internet communications, telecommunications, or any processor-to-processor applications using full-duplex communication.

Figure 18:
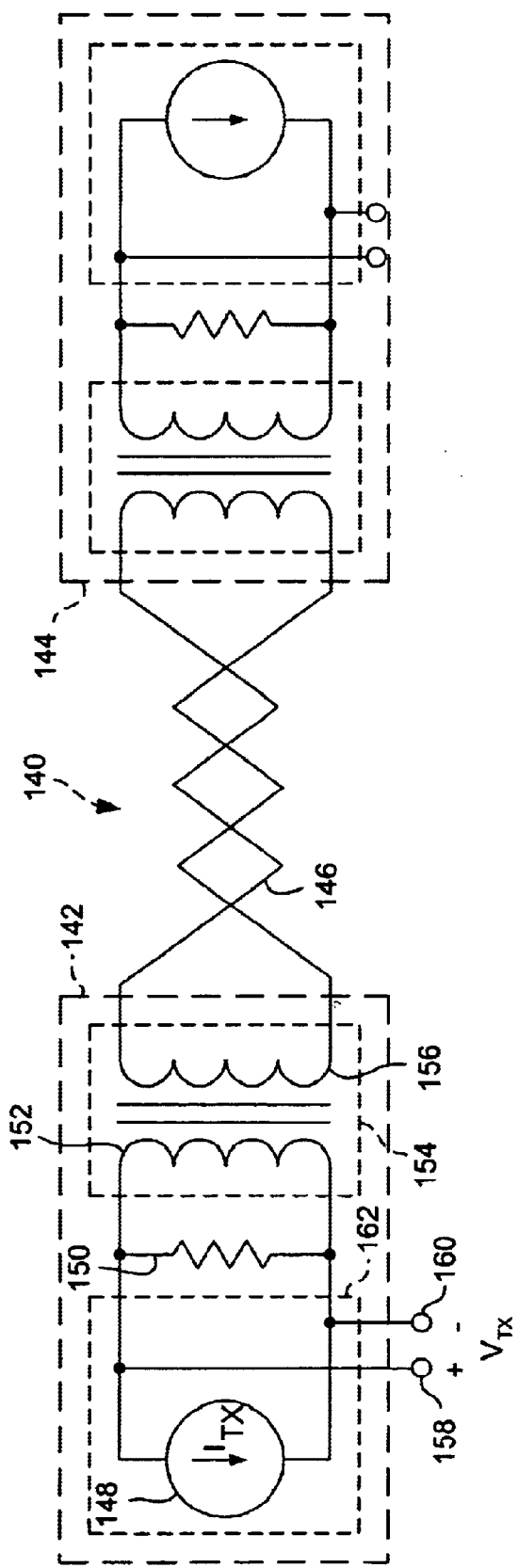
FIG. 18 is a high-level schematic diagram illustrating a communication channel in connection with which the method and apparatus of the present invention may be used.

Communication in an Ethernet computer network is illustrated in FIG. 18. As shown, an Ethernet communication channel 140 comprises a first Ethernet transceiver 142, a second Ethernet transceiver 144, and a two-wire interconnection 146 between the first Ethernet transceiver 142 and the second Ethernet transceiver 144. For example, the two-wire interconnection 146 may comprise a single twisted-pair of a Category 5 cable in accordance with IEEE gigabit transmission standard No. 802.3ab. As the Ethernet transceivers 142 and 144 may be substantially identical, only one of them is described herein.

The Ethernet transceiver 142 has a controlled current source 148, which is used to inject into the Ethernet transceiver 142 a control current $I_{TX}$, which corresponds to a signal to be transmitted from the Ethernet transceiver 142 to the Ethernet transceiver 144. Ethernet transceiver 142 also has a termination resistance 150 and a first coil 152 of a center-tap transformer 154. The center-tap transformer 154 also has a second coil 156 coupled to the two-wire interconnection 146 to provide signals transmitted by the first Ethernet transceiver 142 to the second Ethernet transceiver 144. The center-tap transformer 154 serves to couple AC voltage signals between the Ethernet transceivers 142 and 144 while effectively decoupling the Ethernet transceiver 142 from the Ethernet transceiver 144 with respect to DC voltage signals. A pair of terminals 158, 160 is provided to measure a voltage $V_{TX}$ present across the resistor 150 as a result of both signals transmitted by the Ethernet transceiver 142 and signals received by the Ethernet transceiver 142 from the Ethernet transceiver 144 via the two-wire interconnection 146. The voltage $V_{TX}$ thus comprises a composite differential signal that includes a differential transmission signal component and a differential receive signal component.

As described in more detail below, the differential receive signal component of the composite differential signal $V_{TX}$ is determined in accordance with the present invention by subtracting a replica of the differential transmission signal component from the composite differential signal $V_{TX}$. In the illustrated embodiment, the Ethernet transceiver 142 includes the termination resistance 150, the center-tap transformer 154, and an integrated circuit 162 containing communications circuitry for implementing the functionality of the Ethernet transceiver 142.

Figure 19:
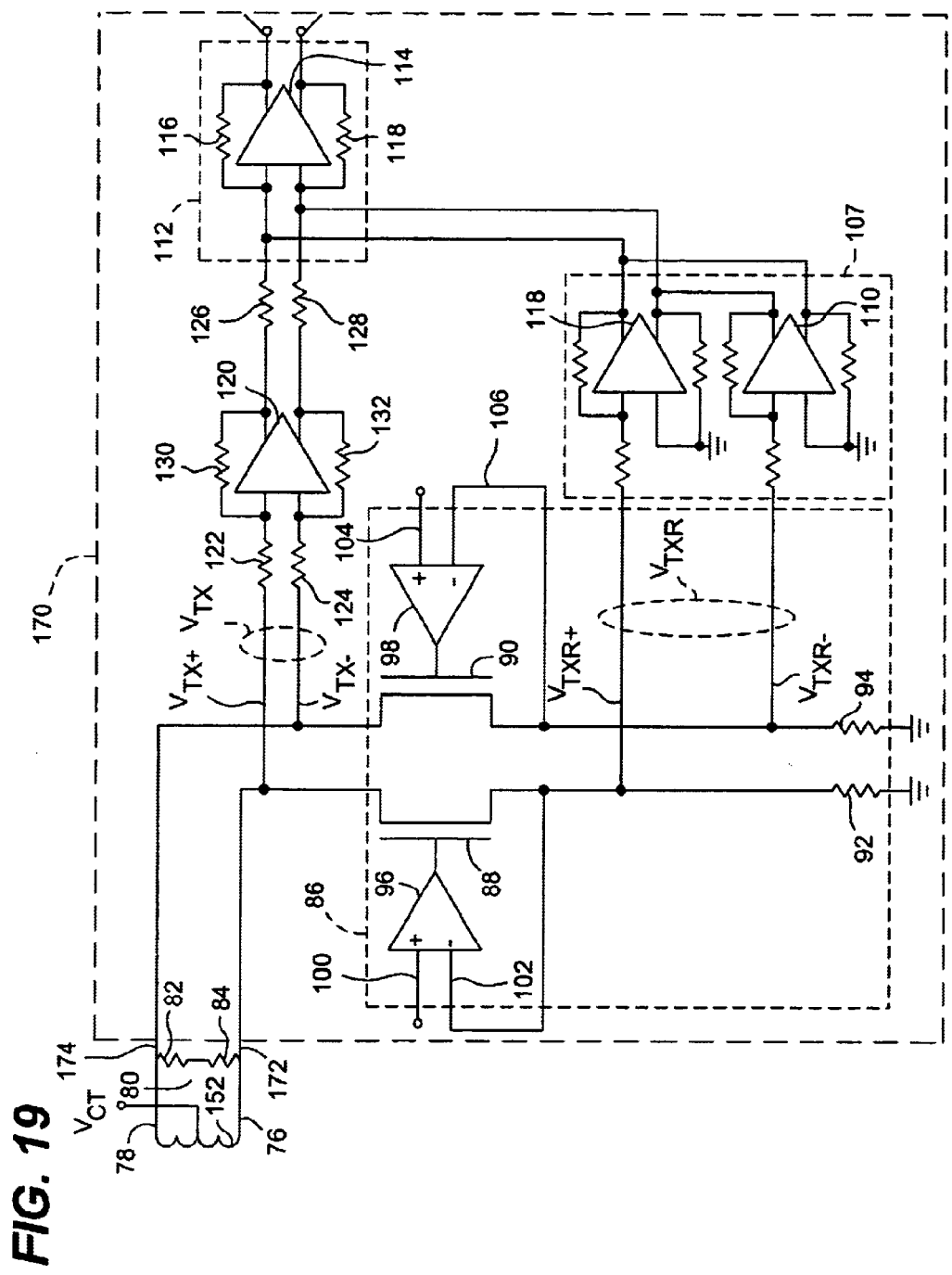
FIG. 19 is a detailed schematic diagram illustrating one embodiment of a transceiver according to the principles of the present invention.

An exemplary embodiment of such Ethernet transceiver communications circuitry is illustrated in the schematic of FIG. 19. As shown in FIG. 19, an integrated circuit 170 has a pair of output terminals 172, 174, which are coupled to terminals 76, 78, respectively, of the winding 152 of the center-tap transformer 154. Current in the winding 152 of the center-tap transformer 154 induces a proportional current in the secondary winding (not shown in FIG. 19) of the center-tap transformer 154, and that proportional current is communicated over the two-wire interconnection 146 (FIG. 18) to another Ethernet transceiver coupled thereto. Also coupled between the output terminals 172, 174 is a termination resistance 80, which, in the illustrated embodiment of FIG. 19, comprises a pair of termination resistors 82, 84. Preferably, the termination resistors 82, 84 have resistance values to substantially match the 100 ohm characteristic impedance of Category 5 cable in accordance with established standards for Ethernet connections.

The integrated circuit 170 also includes a transmission signal replicator 86 or other suitable circuitry for generating first and second single-ended replica transmission signals $V_{TXR+}$ and $V_{TXR-}$, which together substantially comprise a replica of the differential transmission component of the composite differential signal $V_{TX}$. In the illustrated embodiment, the transmission signal replicator 86 comprises a pair of metal-oxide semiconductor (MOS) transistors 88, 90.

The transistor 88 is coupled between the output terminal 172 and one end of a resistor 92, the other end of the resistor 92 being coupled to ground. Similarly, the transistor 90 is coupled between the output terminal 174 and one end of a resistor 94, the other end of which is coupled to ground. The gate of each transistor 88, 90 is coupled to and driven by the output of a respective operational amplifier 96, 98. The operational amplifier 96 has a non-inverting input 100 and an inverting input 102. The inverting input 102 of the operational amplifier 96 receives a feedback signal from the junction of the source of the transistor 88 and the resistor 92. Likewise, the operational amplifier 98 has a non-inverting input 104 and an inverting input 106, which receives a feedback signal from the junction of the source of the transistor 90 and the resistor 94.

A differential control voltage signal is applied between the non-inverting input 100 of the operational amplifier 96 and the non-inverting input 104 of the operational amplifier 98. This differential control voltage signal, when subjected to the voltage-to-current conversion brought about by the transmission signal replicator 86, provides the differential transmit signal component at the output terminals 172, 174. The feedback signal to the inverting input 102 of the operational amplifier 96 comprises a first single-ended replica transmit signal $V_{TXR+}$, and the feedback signal to the inverting input 106 of the operational amplifier 98 comprises a second replica transmit signal $V_{TXR-}$.

The single-ended replica transmit signals $V_{TXR+}$ and $V_{TXR-}$ are converted to a differential replica transmit signal by a converter circuit 107, which comprises respective differential operational amplifiers 108, 110, each provided with suitable input and feedback resistors, as shown in FIG. 19. The outputs of the differential operational amplifiers 108 and 10 are coupled to a differential active summer 112, which, in the embodiment of FIG. 19, comprises a differential operational amplifier 114 with feedback resistors 116, 118.

Because the differential operational amplifiers 108 and 10 introduce a delay into the replica transmissions signals $V_{TXR+}$ and $V_{TXR-}$, the composite differential signal $V_{TX}$ is coupled to the differential active summer 112 through a further differential operational amplifier 120 arranged in a unity-gain configuration, with input resistors 122, 124, output resistors 126, 128, and feedback resistors 130, 132. This unity-gain operational amplifier simply provides a delay in the composite differential signal $V_{TX}$ which preferably substantially matches the delay introduced in the replica transmission signals $V_{TXR+}$ and $V_{TXR-}$ by the operational amplifiers 108 and 110. As will be readily appreciated by those of ordinary skill in the art, the various input; output, and feedback resistance values associated with the operational amplifiers 108, 110, and 120 may be selected to ensure that these delays are substantially equal to one another.

Figure 20:
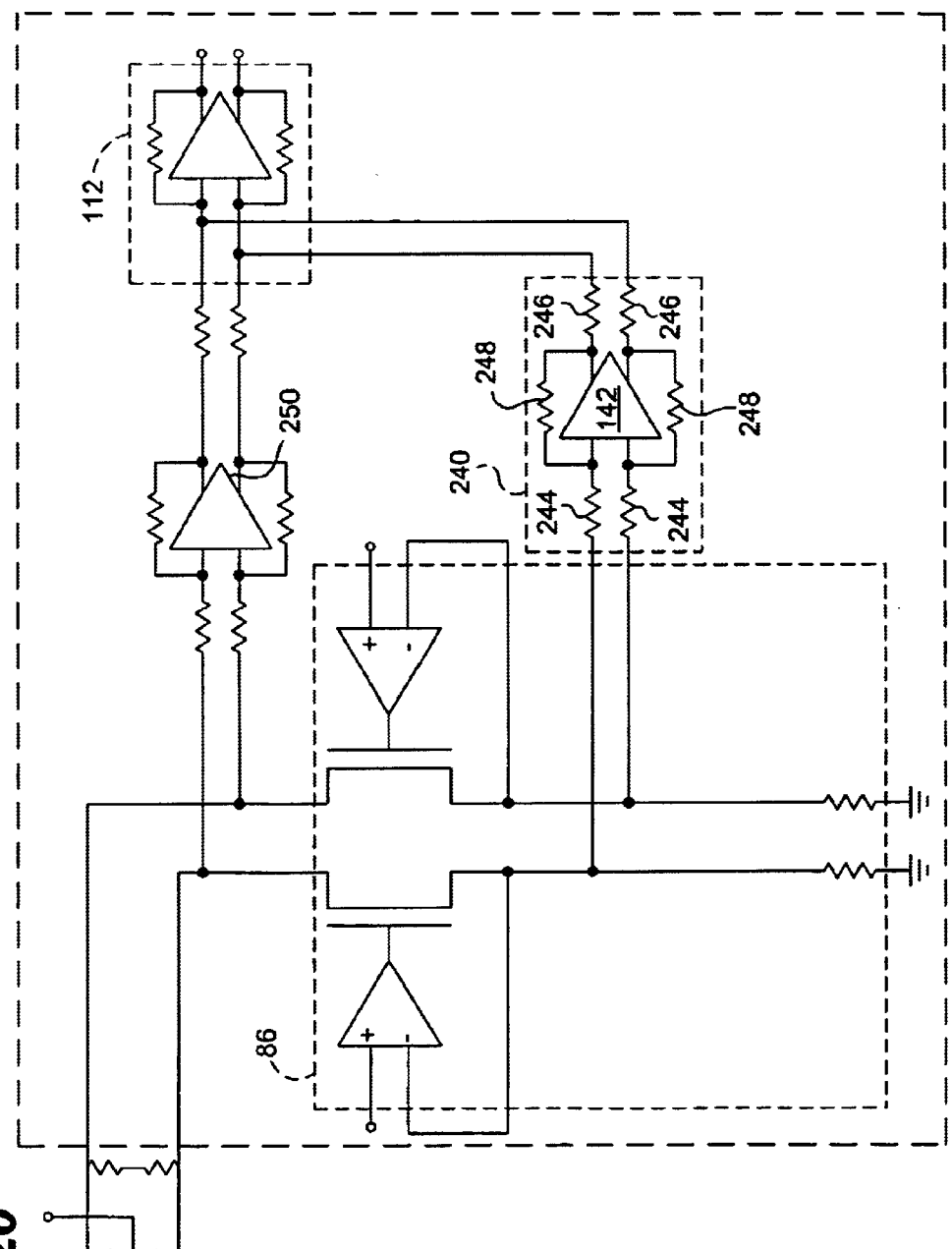
FIG. 20 is a detailed schematic diagram illustrating a second embodiment of a transceiver according to the principles of the present invention.

An alternative embodiment of a communications circuit in accordance with the present invention is shown in the schematic diagram of FIG. 20. Because the transmission signal replicator 86 and the differential active summer 112 in the embodiment of FIG. 20 are identical to those in the embodiment of FIG. 19, the details of those sub-circuits are omitted from the description of the embodiment of FIG. 20. The embodiment of FIG. 20, however, differs from the embodiment of FIG. 19 in the structure of the sub-circuit provided for converting the single-ended replica transmission signals $V_{TXR+}$ and $V_{TXR-}$ into a differential replica transmission signal $V_{TXR}$.

More particularly, as shown in FIG. 20, a converter circuit 240 is coupled to the transmission signal replicator 86 and to the differential active summer 112 to produce the differential replica transmission signal $V_{TXR}$ from the single-ended replica transmission signals $V_{TXR+}$ and $V_{TXR-}$. Converter circuit 240 includes an operational amplifier 242, input resistors 244, feedback resistors 248, and output resistors 246. Just as in the embodiment of FIG. 19, the embodiment of FIG. 20 includes a unity-gain differential operational amplifier 150, which provides a delay in the differential composite signal $V_{TX}$ to substantially match the delay introduced in the differential replica transmission signal $V_{TXR}$ by the converter circuit 240. As will be appreciated by those of ordinary skill in the art, the differential operational amplifier 150 is preferably provided with input, output, and feedback resistors having resistance values which give the differential operational amplifier 150 a unity-gain value. Accordingly, the differential active summer 112 receives as input the delayed differential composite signal $V_{TX}$ and the delayed differential replica transmission signal $V_{TXR}$ and subtracts the latter signal from the former to produce at an output of the differential active summer 112 a differential receive signal which comprises the composite differential signal minus the differential replica transmission signal and thus corresponds to the signal received by the transceiver 170.

The simplification of the converter circuit 240 in the embodiment of FIG. 20, compared to the converter circuit 107 in the embodiment of FIG. 19, is made possible by the fact that the single-ended replica transmission signals $V_{TXR+}$ and $V_{TXR-}$ produced by the transmission signal replicator 86 in the illustrated embodiment are characterized by the feature that when $V_{TXR+}$ is asserted then $V_{TXR-}$ is zero (or ground), and when $V_{TRX-}$ is asserted then $V_{TXR+}$ is zero (or ground). It is because the single-ended replica transmission signals $V_{TXR+}$ and $V_{TXR-}$ have this characteristic that the two differential operational amplifiers 108 and 10 of the converter circuit 107 in the embodiment of FIG. 19 can be replaced by the single differential operational amplifier 142 in the converter circuit 240 of the embodiment of FIG. 20.

This reduction in components in the converter circuit 240 provides not only substantial simplification of the integrated circuit 170 as a whole, but it also reduces the well-recognized manufacturing problem of component mismatch, such as between the two differential operational amplifiers 108 and 10 of the embodiment of FIG. 19, for example, and improves common-mode rejection, which, in turn, results in overall improved performance of the transceiver 142.

Figure 21:
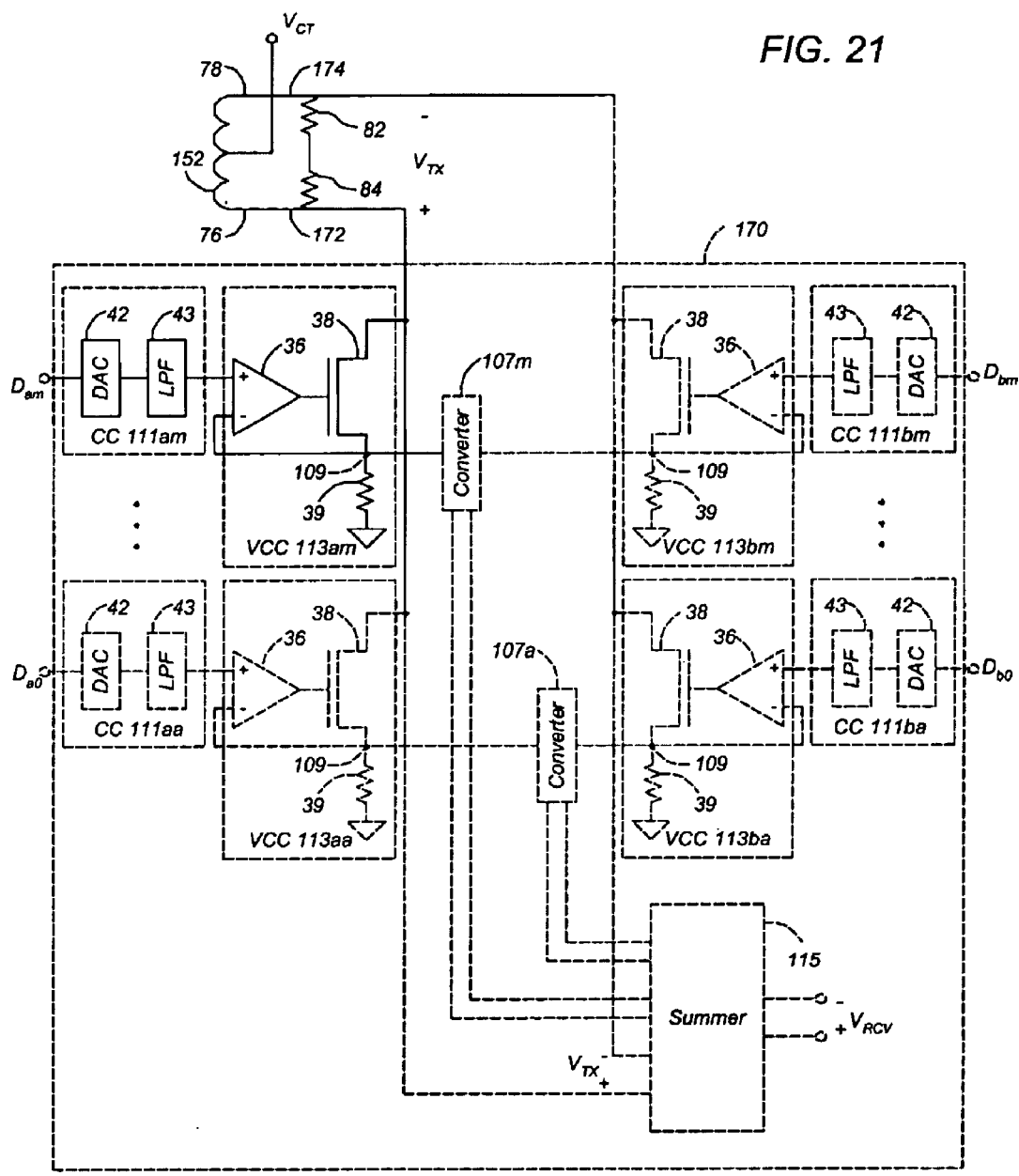
FIG. 21 is a detailed schematic diagram illustrating a third embodiment of a transceiver according to the principles of the present invention.

Another exemplary embodiment of Ethernet transceiver communications circuitry is illustrated in the schematic of FIG. 21. Referring to FIG. 21, integrated circuit 170 comprises m differential pairs of voltage-to-current converters (VCC) 113. In the preferred embodiment, each VCC 113 comprises a voltage buffer comprising an operational amplifier 36, a transistor 38, and a resistor 39. The inverting input of each operational amplifier 36 receives a feedback signal from a node 109 at the junction of the source of a transistor 38 and a resistor 39. The non-inverting input of each operational amplifier 36 receives a control signal generated by a control circuit (CC) 111 comprising a DAC 42 and an optional low-pass filter (LPF) 43 in response to a bit of a digital control signal D. An important feature is that DAC 42 determines the slew rate. In the preferred embodiment, PF 43 can be implemented as a single-pole filter. Each VCC 113 generates a bi-level transmit signal component in response to the analog control signal. In a preferred embodiment for use with Gigabit Ethernet, integrated circuit 170 includes 8 differential pairs of VCCs, and so is capable of producing a 17-level signal.

The transmit signal components generated by VCCs 113aa through 113 am are combined to provide a multi-level signal that forms a first polarity of differential transmit signal $V_T$, which appears at terminals 172, 174 as a component of composite signal $V_{TX}$. The transmit signal components generated by VCCs 113ba through 113bm are combined to provide a multi-level signal that forms a second polarity of signal $V_T$. Composite signal $V_{TX}$ is fed to a differential active summer 115, which can be implemented in a manner similar to summer 112 of FIG. 19. Summer 115 also receives replicas of the transmit signal components produced by each VCC 113.

Figure 24:
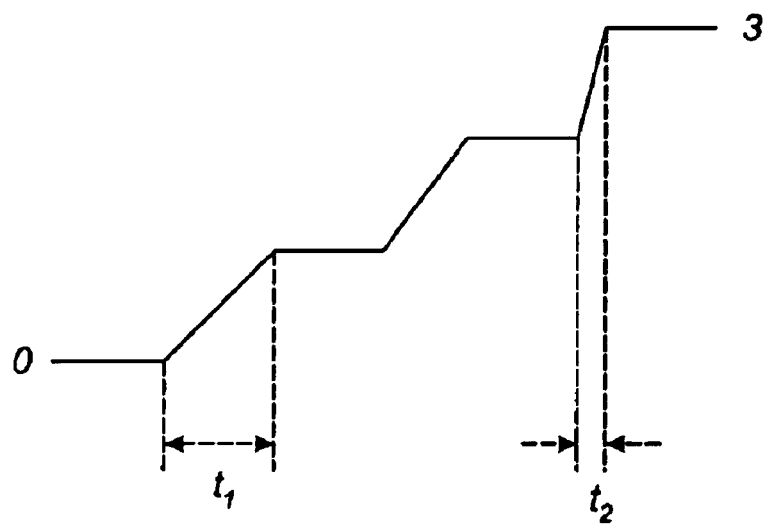
FIG. 24 shows a waveform produced by the D/A circuit of FIG. 5.
Figure 25:
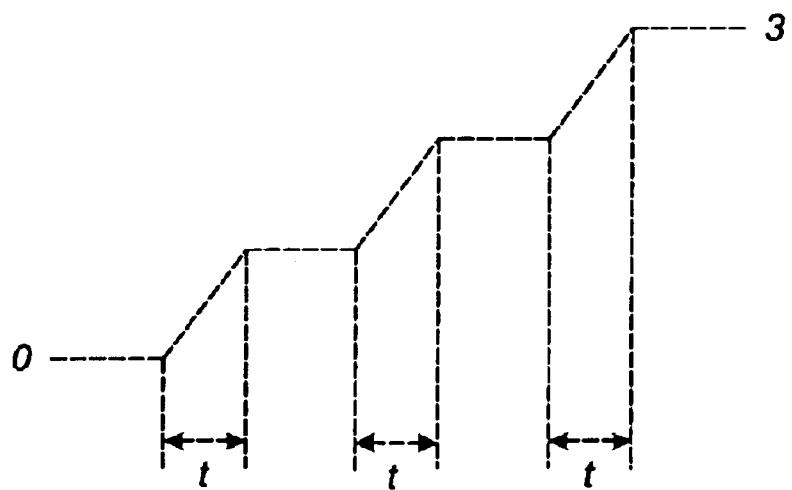
FIG. 25 shows a waveform produced by the circuit of FIG. 21.

One feature of the arrangement of FIG. 21 is that the transmit signal is free of the distortion shown in FIG. 24. FIG. 25 shows a waveform produced by the circuit of FIG. 21. Because each level of the transmit signal is generated independently by similar circuits, the slew rates are the same for each signal level. Consequently, as shown in FIG. 25, the rise time t for each signal level is the same.

Another feature of the arrangement of FIG. 21 is the provision of an accurate replica of the transmit signal components produced by the VCCs. In particular, referring to FIG. 21, the current that generates a replica of a transmit signal component at a node 109 is the very same current that generates the transmit signal component. Hence, the replica signal produced by a VCC 113 is unaffected by process and temperature variations, and so is a very accurate replica of the transmit signal component generated by that VCC 113. Further, because node 109 is a low-impedance node, the replica signal can be tapped at node 109 with very little disturbance to the transmit signal component.

For example VCC 113am is paired with VCC 113bm. Each VCC 113 in a differential pair provides a replica signal component to a converter 107, which can be implemented as shown in FIG. 19. For example, VCC 113am and VCC 113bm provide replica signal components to converter 107m. Each converter produces a differential replica signal component based on the single-ended signals received from the VCCs 113, and provides the differential replica signal components to summer 115. Summer 115 obtains the received signal $V_{RCV}$ by subtracting the differential replica signal components from the composite signal $V_{TX}$ that is present at the transceiver output terminals.

Figure 26:
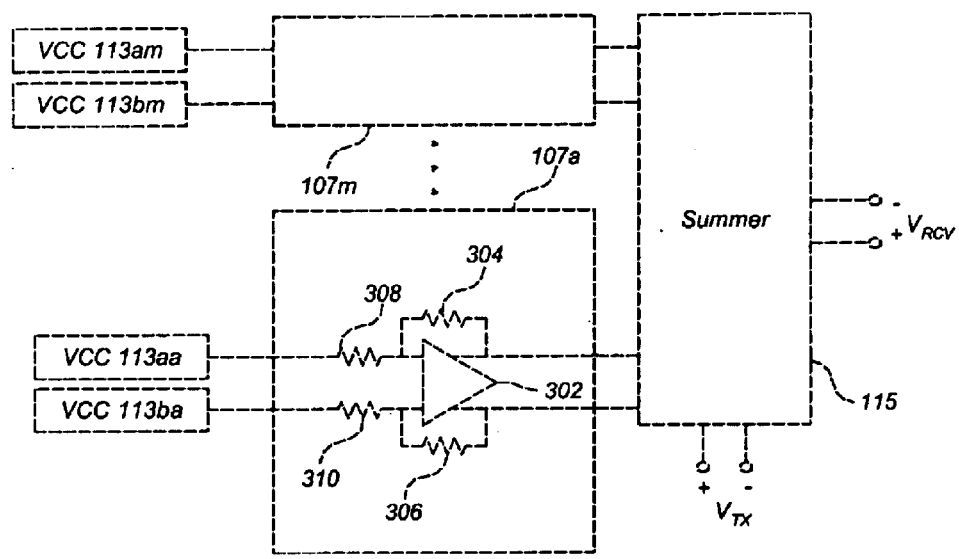
FIG. 26 shows detail of a converter according to one implementation.

FIG. 26 shows detail of a converter 107a according to one implementation. The outputs of VCCs 113aa and 113ba are coupled through resistors 308 and 310 to a differential operational amplifier 302 having feedback resistors 304 and 306. The outputs of differential operational amplifier 302 are supplied to summer 115. The remaining converters 107 are similarly implemented and connected to summer 115.

Figure 27:
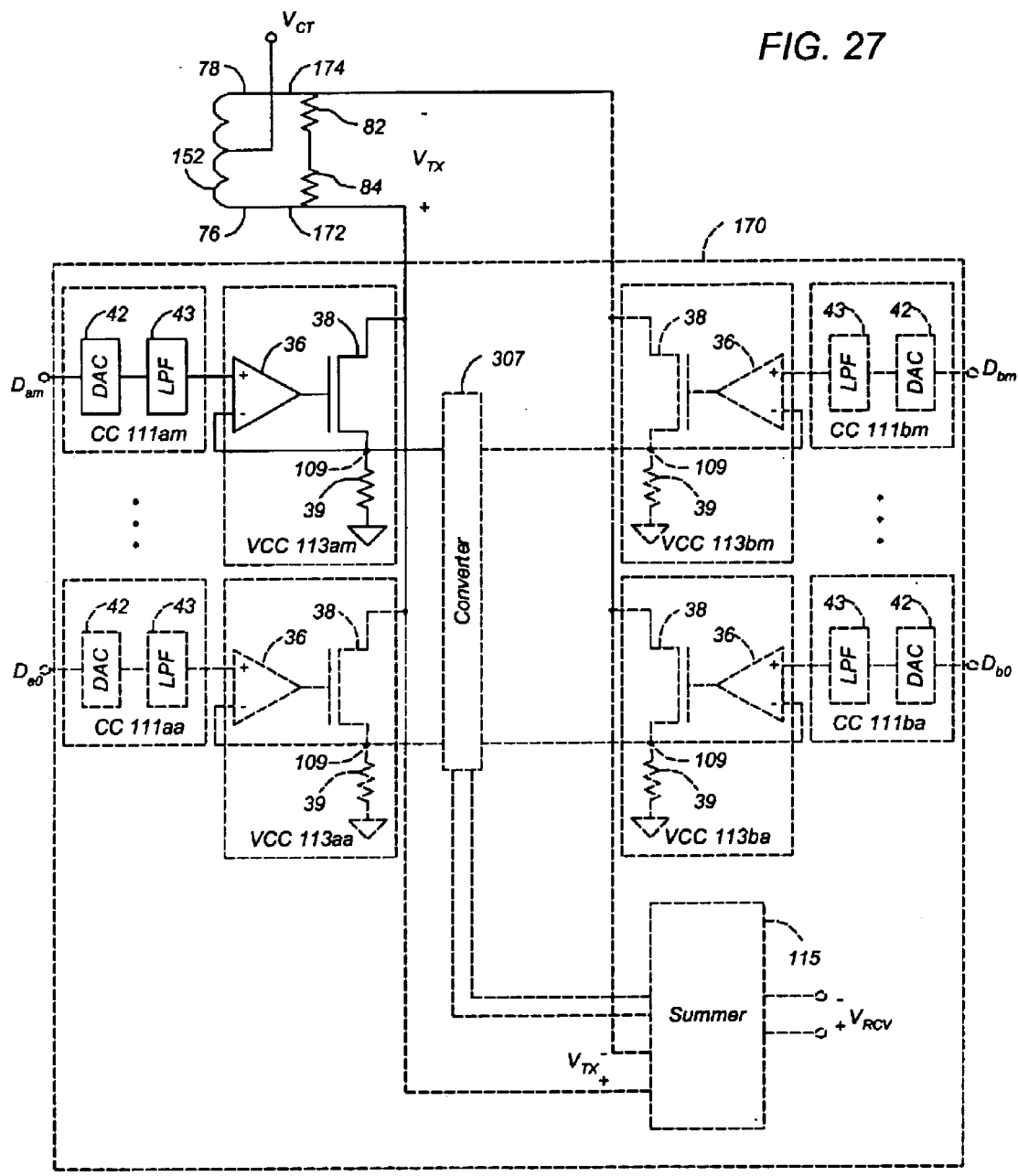
FIG. 27 is a detailed schematic diagram illustrating a fifth embodiment of a transceiver according to the principles of the present invention.

Another exemplary embodiment of Ethernet transceiver communications circuitry is illustrated in the schematic of FIG. 27. The integrated circuit 170 of FIG. 27 differs from that of FIG. 21 in that a single converter 307 replaces the multiple converters 107a through 107m of FIG. 21.

Figure 28:
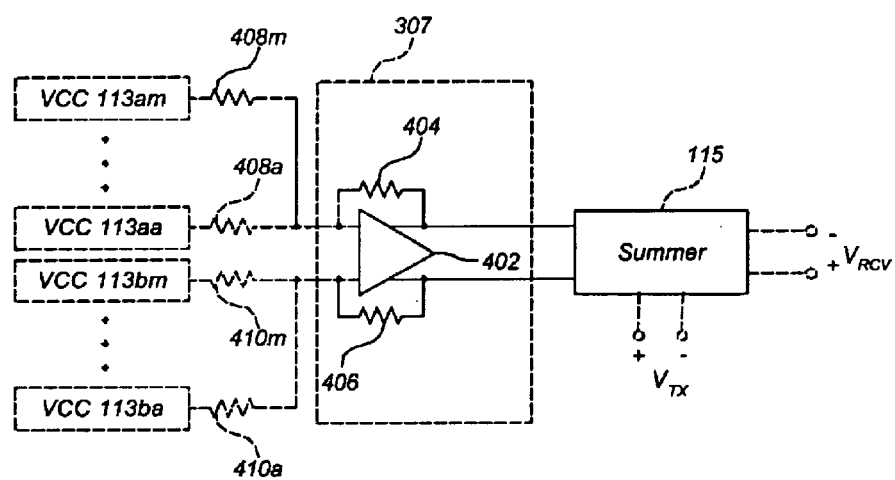
FIG. 28 shows detail of converter according to one implementation.

FIG. 28 shows detail of converter 307 according to one implementation. The outputs of VCCs 113aa through 113am are coupled through resistors 408a through 408m to one input of a differential operational amplifier 402 having feedback resistors 404 and 406. The outputs of VCCs 113ba through 113bm are coupled through resistors 410a through 410m to the other input of differential operational amplifier 402. The outputs of differential operational amplifier 402 are supplied to summer 115.

Figure 22:
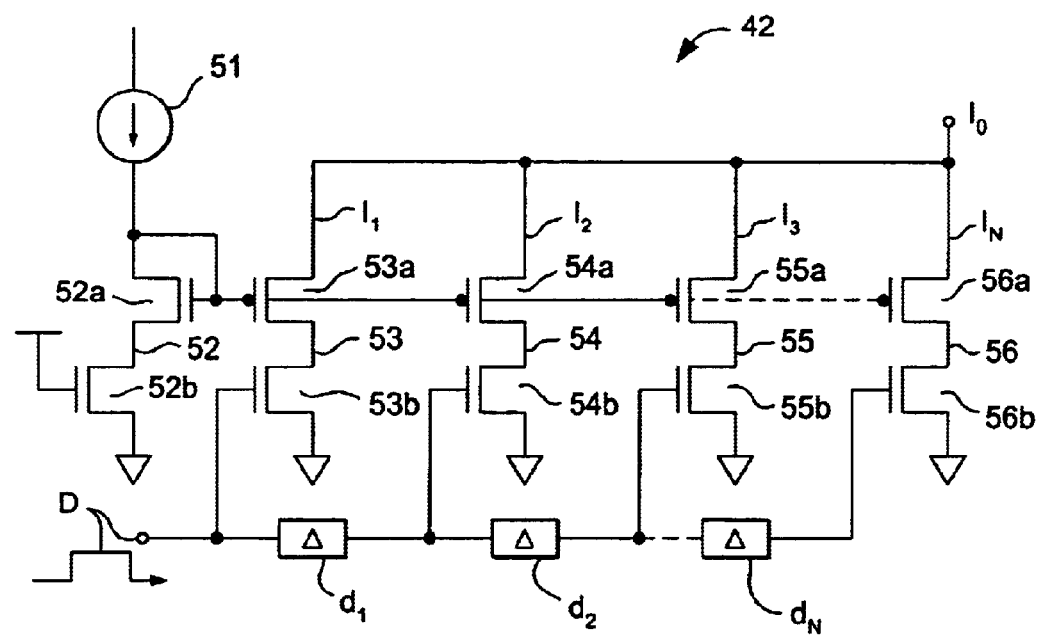
FIG. 22 shows detail of a DAC according to some implementations.

FIG. 22 shows detail of a DAC 42 according to some implementations. Referring to FIG. 22, DAC 42 operates as described above for the current source 50 of FIG. 12. DAC 42 receives a bit D from decoder 166, and provides a control current Io to LPF 43. Current Io is a staircase waveform such as those discussed above with reference to FIGS. 15a and 15b. Because this control signal determines the rise time of the output of each DAC, the LPFs 43 produce a smoother output. This embodiment solves two problems. First, by providing the LPFs with a staircase waveform, the LPFs merely smooth the staircase waveform rather than define rise time. Second, because the DACs 42 are disposed in parallel, there are no variations in rise time because each DAC 42 has substantially the same current passing therethrough; that is, there is no bandwidth variation with resultant differences in rise time. The DACs 42 may also be controlled by any appropriate circuitry, such as a decoder disposed prior to the DACs which would, in effect, select which DACs are activated by proper application of the input signals. In other implementations each DAC 42 provides a single-step waveform to a LPF 43.

Thus each control circuit 111 (formed by a DAC 42 and a LPF 43) provides a ramp waveform to one of the voltage-to-current converters 113, thereby controlling the slew rates of the voltage-to-current converters. Controlling the slew rates in this manner reduces unwanted high-frequency components that would be generated with higher slew rates. Further, because the slew rates are similar for each of the voltage-to-current converters, the bandwidth of the multi-level transmit signal is not dependent on the value of the control signal, resulting in a signal with small and uniform distortion across signal levels.

Figure 29:
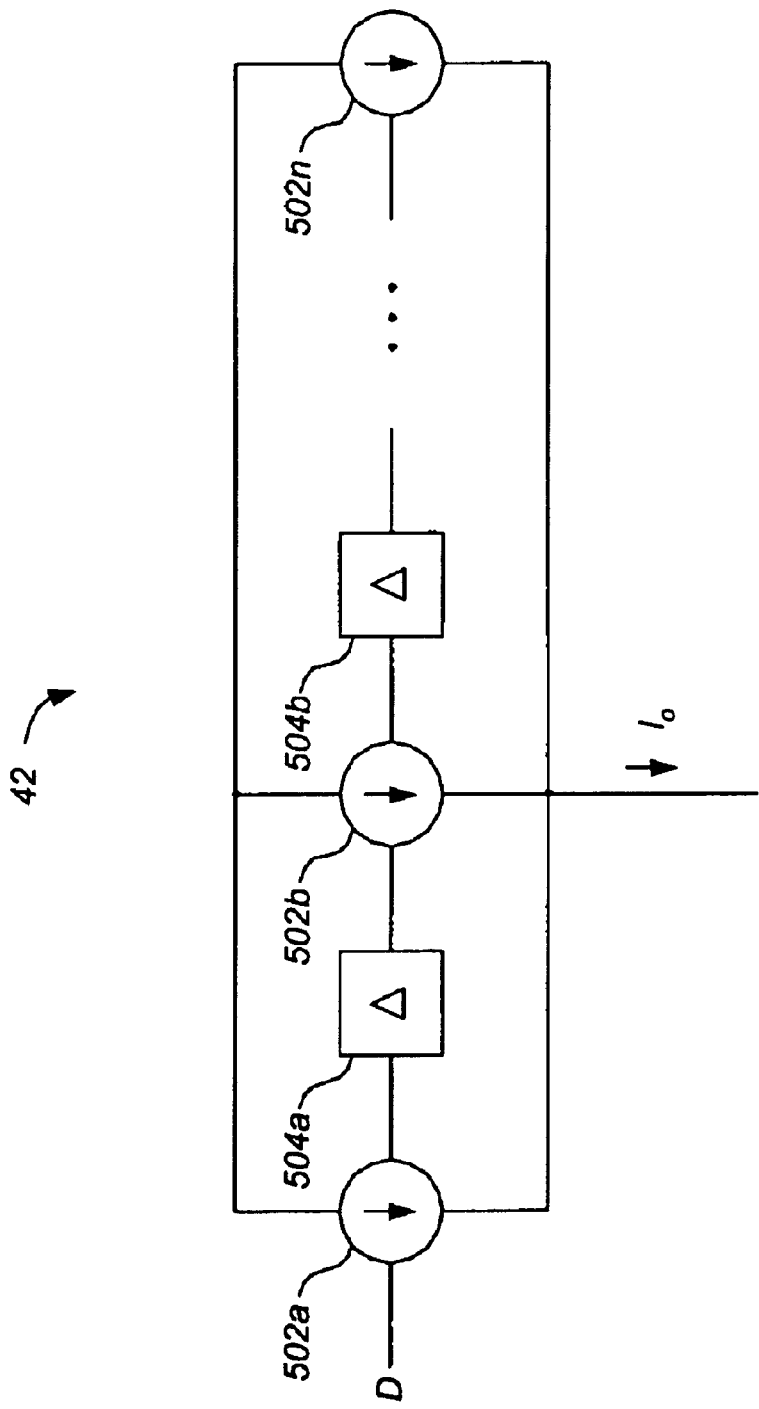
FIG. 29 shows detail of a DAC according to some implementations.

FIG. 29 shows detail of a DAC 42 according to some implementations. DAC 42 includes a plurality of current sources 502a, 502b through 502n, and a plurality of delay elements 504. Current source 502a receives a bit D from decoder 166, and generates a current in response. Delay unit 504a provides a delayed signal to a current source 502b, which provides a delayed current, and so on. The sum of the currents are provided as current Io.

Figure 23:
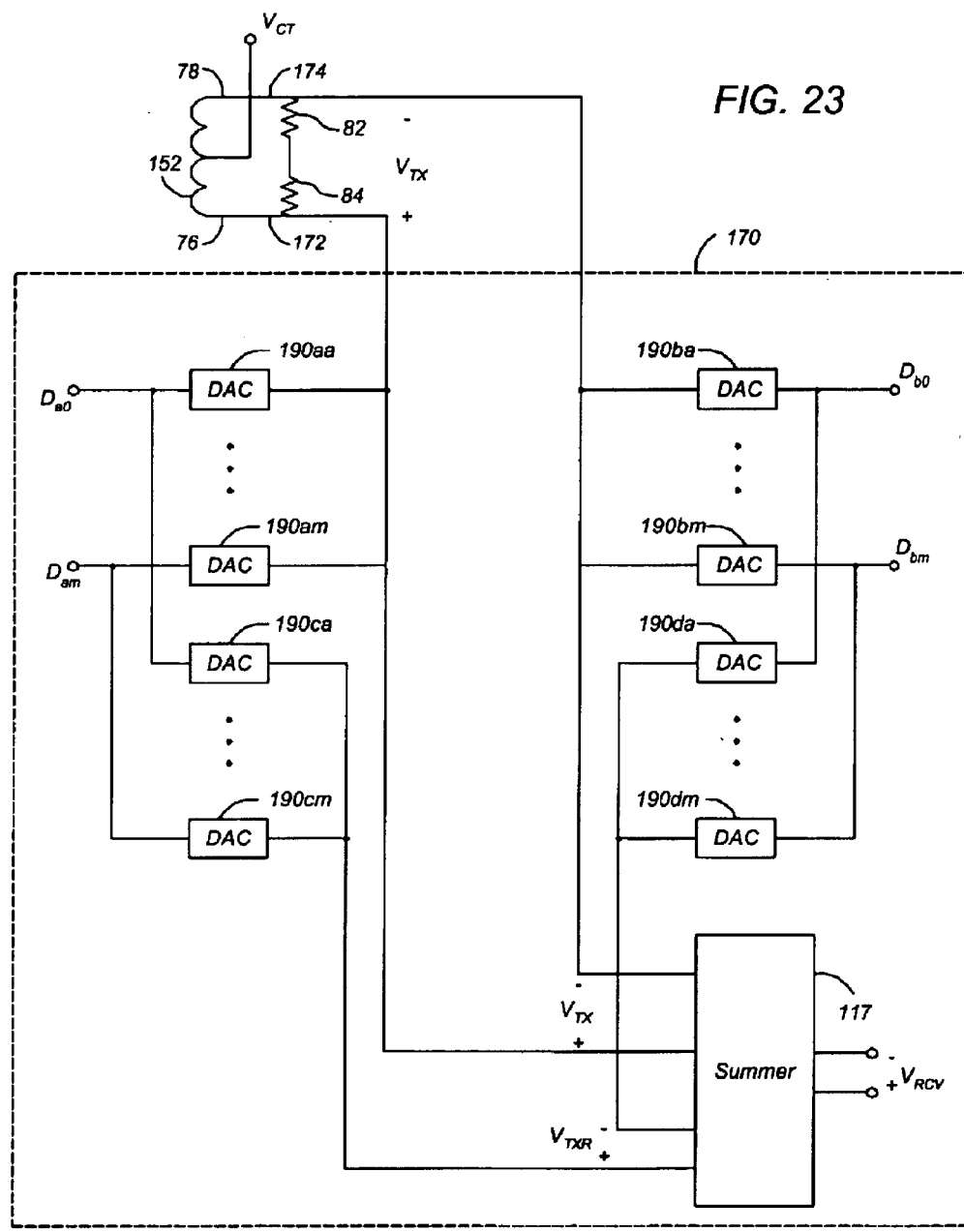
FIG. 23 is a detailed schematic diagram illustrating a fourth embodiment of a transceiver according to the principles of the present invention.

Another exemplary embodiment of Ethernet transceiver communications circuitry is illustrated in the schematic of FIG. 23. Referring to FIG. 23, integrated circuit 170 comprises m differential pairs of digital-to-analog converters (DAC) 190. Each DAC 190 provides a transmit signal component in response to a bit D of a digital control signal. The transmit signal components provided by DACs 190aa through 190am are combined to produce a first polarity of differential transmit signal $V_T$, which appears at terminals 172, 174 as a component of composite signal $V_{TX}$. Similarly, the transmit signal components provided by DACs 190ba through 190bm are combined to produce a second polarity of differential transmit signal $V_T$. Signal $V_{TX}$ is also fed to summer 117.

Summer 117 also receives a replica of the transmit signal components produced by DACs 190a and 190b. The replicas are produced by DACs 190ca through 190 cm and DACs 190da through 190dm. Summer 117 subtracts the replica signal $V_{TXR}$ from the composite signal $V_{TX}$ to obtain the receive signal $V_{RCV}$. In some implementations each DAC 190 is implemented as shown in FIG. 22.

The individual components shown in outline or designated by blocks in the attached drawings are all well-known in the arts, and their specific construction and operation are not critical to the operation or best mode for carrying out the invention.

While the present invention has been described with respect to what is presently considered to be the preferred embodiments, it will be understood that the invention is not limited to the disclosed embodiments. To the contrary, the invention covers various modifications and equivalent arrangements included within the spirit and scope of the appended claims. The scope of the claims is to be accorded the broadest interpretation so as to encompass all such modifications and equivalent structures and functions. For example, the input signals for FIGS. 7, 11, 13, 14 and 16 may be varied to produce different output waveforms. Also, the linear ramp produced by the current source of FIGS. 11 and 13, may be even further processed by the current source of FIG. 7, to produce smooth transition areas. Such modifications are within the scope of the present invention. Also, whereas the illustrated transistors are preferably CMOS transistor, n-type or p-type transistors may also be employed with the present invention.

What is claimed is:

1. A communication circuit comprising:
   a digital-to-analog converter to receive a digital control signal, and to provide an analog control signal, the digital-to-analog converter comprising
      N current sources configured in a parallel arrangement,
         wherein N is at least two, and
         wherein each of the N current sources includes a respective control input,
      M delay elements, an mth one of the M delay elements including an input in communication with an m−1th one of the M delay elements,
         wherein M is equal to N−1,
         wherein an output of the mth one of the M delay elements controls the control input of an m+1th one of the N current sources,
         wherein an input of a first one of the M delay elements receives the digital control signal, and
         wherein the analog control signal comprises the sum of the outputs of the N current sources; and
   a voltage-to-current converter to provide a transmit signal based on the analog control signal.

2. The communication circuit of claim 1, wherein the M delay elements comprise at least one delay lock loop.

3. The communication circuit of claim 1, wherein the transmit signal is a Class B signal.

4. The communication circuit of claim 1, further comprising:
   a low-pass filter to receive the analog control signal, and to provide a filtered analog control signal to the voltage-to-current converter.

5. The communication circuit of claim 4, wherein the low-pass filter comprises a single-pole filter.

6. The communication circuit of claim 1, wherein the voltage-to-current converter provides a replica of the transmit signal.

7. The communication circuit of claim 1, wherein the voltage-to-current converter comprises a voltage buffer.

8. The communication circuit of claim 1, wherein the communication circuit operates at up to gigabit speeds.

9. A communication circuit, comprising:
   a digital-to-analog converter to receive a digital control signal, and to provide an analog control signal, the digital-to-analog converter comprising:
      N current sources configured in a parallel arrangement, wherein N is at least two, and wherein each of the N current sources includes a respective control input,
      M delay elements, an mth one of the M delay elements including an input in communication with an m−1th one of the M delay elements, wherein M is equal to N−1, wherein an output of the mth one of the M delay elements is arranged in communication with the control input of an m+1th one of the N current sources, wherein an input of a first one of the M delay elements receives the digital control signal, and
      wherein the analog control signal comprises the sum of the outputs of the N current sources;
   a voltage-to-current converter to provide a transmit signal based on the analog control signal,
      wherein the voltage-to-current-converter provides a replica of the transmit signal;
   a first sub-circuit having a composite input to receive a differential composite signal comprising the transmit signal, a replica input to receive a differential replica signal comprising the replica of the transmit signal, and a difference output to provide a differential difference signal representing a difference between the differential composite signal and the differential replica signal;
   a second sub-circuit which produces first and second single-ended replica signals which together substantially comprise the differential replica signal; and
   a third sub-circuit, which is coupled to the first and second sub-circuits, and which produces the differential replica signal from the first and second single-ended replica signals.

10. A communication circuit comprising:
   K digital-to-analog converters each receiving a corresponding digital control signal and each providing a corresponding analog control signal, wherein K is at least two;
   K voltage-to-current converters each providing a corresponding bi-level transmit signal component in accordance with a respective one of the corresponding analog control signals; and
      wherein the corresponding bi-level transmit signal component of each of the K voltage-to-current converters are combined to produce a J-level transmit signal, wherein J=K+1.

11. The communication circuit of claim 10, wherein the J-level transmit signal is a Class B signal.

12. The communication circuit of claim 10, wherein each of the K digital-to-analog converters comprises:
   N current sources configured in a parallel arrangement, wherein N is at least two, and wherein each of the N current sources includes a respective control input;
   M delay elements, an mth one of the M delay elements including an input in communication with an m−1th one of the M delay elements, wherein M is equal to N−1, wherein an output of the mth one of the M delay elements is arranged in communication with the control input of an m+1th one of the N current sources, wherein an input of a first one of the M delay elements receives the corresponding digital control signal.

13. The communication circuit of claim 12, wherein the M delay elements comprise at least one delay lock loop.

14. The communication circuit of claim 10, wherein the K voltage-to-current converters provide a replica of the J-level transmit signal.

15. The communication circuit of claim 10, wherein each of the K voltage-to-current converters comprises a voltage buffer.

16. The communication circuit of claim 10, wherein the communication circuit operates at up to gigabit speeds.

17. A communication circuit, comprising:
   K digital-to-analog converters each receiving a corresponding digital control signal and each providing a corresponding analog control signal, wherein K is at least two;
   K voltage-to-current converters each providing a corresponding bi-level transmit signal component in accordance with a respective one of the corresponding analog control signals;
      wherein the corresponding bi-level transmit signal component of each of the K voltage-to-current converters are combined to produce a J-level transmit signal, wherein J=K+1,
      wherein the K voltage-to-current converters provide a replica of the J-level transmit signal,
   wherein the replica of the transmit signal comprises first and second single-ended replica signals;
   a first sub-circuit which produces a differential replica signal from the first and second single-ended replica signals; and
   a second sub-circuit coupled to the first sub-circuit and the voltage-to current converters and having a composite input to receive a differential composite signal comprising the transmit signal, a replica input to receive the differential replica signal, and a difference output to provide a differential difference signal representing a difference between the differential composite signal and the differential replica signal.

18. A communication circuit comprising:
   K digital-to-analog converters each receiving a corresponding digital control signal and each providing a corresponding transmit signal component, wherein K is at least two, and wherein each of the K digital-to-analog converters comprises
      N current sources configured in a parallel arrangement, wherein N is at least two, and wherein each of the N current sources includes a respective control input,
      M delay elements, an mth one of the M delay elements including an input in communication with an m−1th one of the M delay elements, wherein M is equal to N−1, wherein an output of the mth one of the M delay elements controls the control input of an m+1th one of the N current sources, wherein an input of a first one of the M delay elements receives the corresponding digital control signal, and
      wherein the corresponding transmit signal component comprises the sum of the outputs of the N current sources; and
      wherein the corresponding transmit signal component of each of the K digital-to-analog converters are combined to produce a J-level transmit signal, wherein J=K +1.

19. The communication circuit of claim 18, wherein the M delay elements comprise at least one delay lock loop.

20. The communication circuit of claim 18, wherein the J-level transmit signal is a Class B signal.

21. The communication circuit of claim 18, wherein the communication circuit operates at up to gigabit speeds.

22. A communication circuit, comprising:
K digital-to-analog converters each receiving a corresponding digital control signal and each providing a corresponding transmit signal component, wherein K is at least two, and wherein each of the K digital-to-analog converters comprises:
N current sources configured in a parallel arrangement, wherein N is at least two, and wherein each of the N current sources includes a respective control input,
M delay elements, an mth one of the M delay elements including an input in communication with an m−1th one of the M delay elements, wherein M is equal to N−1, wherein an output of the mth one of the M delay elements is arranged in communication with the control input of an m+1th one of the N current sources, wherein an input of a first one of the M delay elements receives the corresponding digital control signal, and
wherein the corresponding transmit signal component comprises the sum of the outputs of the N current sources; and
wherein the corresponding transmit signal component of each of the K digital-to-analog converters are combined to produce a J-level transmit signal, wherein J=K+1; and
L digital-to-analog converters each receiving the corresponding digital control signal and each providing a corresponding replica transmit signal component, wherein L=K; and
wherein the corresponding replica transmit signal component of each of the L digital-to-analog converters are combined to produce a J-level replica transmit signal.

23. An Ethernet controller comprising:
a digital-to-analog converter to receive a digital control signal, and to provide an analog control signal, the digital-to-analog converter comprising
N current sources configured in a parallel arrangement, wherein N is at least two, and wherein each of the N current sources includes a respective control input,
M delay elements, an mth one of the M delay elements including an input in communication with an m−1th one of the M delay elements,
wherein M is equal to N−1,
wherein an output of the mth one of the M delay elements controls the control input of an m+1th one of the N current sources,
wherein an input of a first one of the M delay elements receives the digital control signal, and
wherein the analog control signal comprises the sum of the outputs of the N current sources; and
a voltage-to-current converter to provide a transmit signal based on the analog control signal.

24. The Ethernet controller of claim 23, wherein the M delay elements comprise at least one delay lock loop.

25. The Ethernet controller of claim 23, wherein the transmit signal is a Class B signal.

26. The Ethernet controller of claim 23, further comprising:
a low-pass filter to receive the analog control signal, and to provide a filtered analog control signal to the voltage-to-current converter.

27. The Ethernet controller of claim 26, wherein the low-pass filter comprises a single-pole filter.

28. The Ethernet controller of claim 23, wherein the voltage-to-current converter provides a replica of the transmit signal.

29. The Ethernet controller of claim 23, wherein the voltage-to-current converter comprises a voltage buffer.

30. The Ethernet controller of claim 23, wherein the Ethernet controller operates at up to gigabit speeds.

31. An Ethernet controller, comprising:
a digital-to-analog converter to receive a digital control signal, and to provide an analog control signal, the digital-to-analog converter comprising:
N current sources configured in a parallel arrangement, wherein N is at least two, and wherein each of the N current sources includes a respective control input,
M delay elements, an mth one of the M delay elements including an input in communication with an m−1th one of the M delay elements, wherein M is equal to N−1, wherein an output of the mth one of the M delay elements is arranged in communication with the control input of an m+1th one of the N current sources, wherein an input of a first one of the M delay elements receives the digital control signal, and
wherein the analog control signal comprises the sum of the outputs of the N current sources;
a voltage-to-current converter to provide a transmit signal based on the analog control signal,
wherein the voltage-to-current converter provides a replica of the transmit signal;
a first sub-circuit having a composite input to receive a differential composite signal comprising the transmit signal, a replica input to receive a differential replica signal comprising the replica of the transmit signal, and a difference output to provide a differential difference signal representing a difference between the differential composite signal and the differential replica signal;
a second sub-circuit which produces first and second single-ended replica signals which together substantially comprise the differential replica signal; and
a third sub-circuit, which is coupled to the first and second sub-circuits, and which produces the differential replica signal from the first and second single-ended replica signals.

32. An Ethernet controller comprising:
K digital-to-analog converters each receiving a corresponding digital control signal and each providing a corresponding analog control signal, wherein K is at least two;
K voltage-to-current converters each providing a corresponding bi-level transmit signal component in accordance with a respective one of the corresponding analog control signals; and
wherein the corresponding bi-level transmit signal component of each of the K voltage-to-current converters are combined to produce a J-level transmit signal, wherein J=K+1.

33. The Ethernet controller of claim 32, wherein the J-level transmit signal is a Class B signal.

34. The Ethernet controller of claim 32, wherein each of the K digital-to-analog converters comprises:
N current sources configured in a parallel arrangement, wherein N is at least two, and wherein each of the N current sources includes a respective control input;
M delay elements, an mth one of the M delay elements including an input in communication with an m−1th one of the M delay elements, wherein M is equal to N−1, wherein an output of the mth one of the M delay elements is arranged in communication with the control input of an m+1th one of the N current sources, wherein an input of a first one of the M delay elements receives the corresponding digital control signal.

35. The Ethernet controller of claim 34, wherein the M delay elements comprise at least one delay lock loop.

36. The Ethernet controller of claim 32, wherein the K voltage-to-current converters provide a replica of the J-level transmit signal.

37. The Ethernet controller of claim 32, wherein each of the K voltage-to-current converters comprises a voltage buffer.

38. The Ethernet controller of claim 32, wherein the Ethernet controller operates at up to gigabit speeds.

39. An Ethernet controller, comprising:
K digital-to-analog converters each receiving a corresponding digital control signal and each providing a corresponding analog control signal, wherein K is at least two;
K voltage-to-current converters each providing a corresponding bi-level transmit signal component in accordance with a respective one of the corresponding analog control signals; and
wherein the corresponding bi-level transmit signal component of each of the K voltage-to-current converters are combined to produce a J-level transmit signal, wherein J=K+1,
wherein the K voltage-to-current converters provide a replica of the J-level transmit signal,
wherein the replica of the transmit signal comprises first and second single-ended replica signals;
a first sub-circuit which produces a differential replica signal from the first and second single-ended replica signals; and
a second sub-circuit coupled to the first sub-circuit and the voltage-to current converters and having a composite input to receive a differential composite signal comprising the transmit signal, a replica input to receive the differential replica signal, and a difference output to provide a differential difference signal representing a difference between the differential composite signal and the differential replica signal.

40. An Ethernet controller comprising:
K digital-to-analog converters each receiving a corresponding digital control signal and each providing a corresponding transmit signal component, wherein K is at least two, and wherein each of the K digital-to-analog converters comprises
N current sources configured in a parallel arrangement, wherein N is at least two, and wherein each of the N current sources includes a respective control input,
M delay elements, an mth one of the M delay elements including an input in communication with an m−1th one of the M delay elements, wherein M is equal to N−1, wherein an output of the mth one of the M delay elements controls the control input of an m+1 th one of the N current sources, wherein an input of a first one of the M delay elements receives the corresponding digital control signal, and
wherein the corresponding transmit signal component comprises the sum of the outputs of the N current sources; and
wherein the corresponding transmit signal component of each of the K digital-to-analog converters are combined to produce a J-level transmit signal, wherein J=K+1.

41. The Ethernet controller of claim 40, wherein the M delay elements comprise at least one delay lock loop.

42. The Ethernet controller of claim 40, wherein the J-level transmit signal is a Class B signal.

43. The Ethernet controller of claim 40, wherein the Ethernet controller operates at up to gigabit speeds.

44. An Ethernet controller, comprising:
K digital-to-analog converters each receiving a corresponding digital control signal and each providing a corresponding transmit signal component, wherein K is at least two, and wherein each of the K digital-to-analog converters comprises:
N current sources configured in a parallel arrangement, wherein N is at least two, and wherein each of the N current sources includes a respective control input,
M delay elements, an mth one of the M delay elements including an input in communication with an m−1th one of the M delay elements, wherein M is equal to N−1, wherein an output of the mth one of the M delay elements is arranged in communication with the control input of an m+1th one of the N current sources, wherein an input of a first one of the M delay elements receives the corresponding digital control signal, and
wherein the corresponding transmit signal component comprises the sum of the outputs of the N current sources; and
wherein the corresponding transmit signal component of each of the K digital-to-analog converters are combined to produce a J-level transmit signal, wherein J=K+1; and
L digital-to-analog converters each receiving the corresponding digital control signal and each providing a corresponding replica transmit signal component, wherein L=K; and
wherein the corresponding replica signal component of each of the L digital-to-analog converters are combined to produce a J-level replica transmit signal.

45. A communication circuit comprising:
digital-to-analog converter means for receiving a digital control signal, and for providing an analog control signal, the digital-to-analog converter means comprising
N current source means for providing current configured in a parallel arrangement,
wherein N is at least two, and
wherein each of the N current source means includes a respective means for inputting; and
M delay means for delaying, an mth one of the M delaying means including means for inputting in communication with an m−1th one of the M delay means,
wherein M is equal to N−1, and
wherein means for outputting of the mth one of the M delay means controls the inputting means of an m+1th one of the N current source means, and
wherein the analog control signal comprises the sum of the outputs of the N current source means; and
voltage-to-current converter means for providing a transmit signal based on the analog control signal.

46. The communication circuit of claim 45, wherein the M delay means comprise at least one delay lock loop.

47. The communication circuit of claim 45, wherein the transmit signal is a Class B signal.

48. The communication circuit of claim 45, further comprising:
filter means for receiving the analog control signal, and for providing a low-pass filtered analog control signal to the voltage-to-current converter means.

49. The communication circuit of claim 48, wherein the filter means comprises a single-pole filter.

50. The communication circuit of claim 45, wherein the voltage-to-current converter means provides a replica of the transmit signal.

51. The communication circuit of claim 45, wherein the voltage-to-current converter means comprises a voltage buffer.

52. The communication circuit of claim 45, wherein the communication circuit operates at up to gigabit speeds.

53. A communication circuit, comprising:
digital-to-analog converter means for receiving a digital control signal, and for providing an analog control signal, the digital-to-analog converter means comprising:
N current source means for providing current configured in a parallel arrangement, wherein N is at least two, and wherein each of the N current source means includes a respective means for inputting; and
M delay means for delaying, an mth one of the M delaying means including means for inputting in communication with an m−1th one of the M delay means, wherein M is equal to N−1, and wherein means for outputting of the mth one of the M delay means is arranged in communication with the inputting means of an m+1th one of the N current source means, and
wherein the analog control signal comprises the sum of the outputs of the N current source means;
voltage-to-current converter means for providing a transmit signal based on the analog control signal,
wherein the voltage-to-current converter means provides a replica of the transmit signal;
summing means for receiving a differential composite signal comprising the transmit signal, receiving a differential replica signal comprising the replica of the transmit signal, and providing a differential difference signal representing a difference between the differential composite signal and the differential replica signal;
replicating means for producing first and second single-ended replica signals which together substantially comprise the differential replica signal; and
converting means, which is coupled to the summing means and replicating means, for producing the differential replica signal from the first and second single-ended replica signals.

54. A communication circuit comprising:
K digital-to-analog converter means each for receiving a corresponding digital control signal and each for providing a corresponding analog control signal, wherein K is at least two;
K voltage-to-current converter means each for providing a corresponding bi-level transmit signal component in accordance with a respective one of the corresponding analog control signals; and
wherein the corresponding bi-level transmit signal components of each of the K voltage-to-current converter means are combined to produce a J-level transmit signal, wherein J=K+1.

55. The communication circuit of claim 54, wherein the J-level transmit signal is a Class B signal.

56. The communication circuit of claim 54, wherein each of the K digital-to-analog converter means comprises:
N current source means for providing current configured in a parallel arrangement, wherein N is at least two, and wherein each of the N current source means includes a respective means for inputting; and
M delay means for delaying, an mth one of the M delaying means including means for inputting in communication with an m−1th one of the M delay means, wherein M is equal to N−1, and wherein means for outputting of the mth one of the M delay means is arranged in communication with the inputting means of an m+1th one of the N current source means.

57. The communication circuit of claim 56, wherein the M delay means comprise at least one delay lock loop.

58. The communication circuit of claim 54, wherein the K voltage-to-current converter means provide a replica of the J-level transmit signal.

59. The communication circuit of claim 54, wherein each of the K voltage-to-current converter means comprises a voltage buffer.

60. The communication circuit of claim 54, wherein the communication circuit operates at up to gigabit speeds.

61. A communication circuit, comprising:
K digital-to-analog converter means each for receiving a corresponding digital control signal and each for providing a corresponding analog control signal, wherein K is at least two;
K voltage-to-current converter means each for providing a corresponding bi-level transmit signal component in accordance with a respective one of the corresponding analog control signals,
wherein the corresponding bi-level transmit signal components of each of the K voltage-to-current converter means are combined to produce a J-level transmit signal, wherein J=K+1,
wherein the K voltage-to-current converter means provide a replica of the J-level transmit signal,
wherein the replica of the transmit signal comprises first and second single-ended replica signals;
converter means for producing a differential replica signal from the first and second single-ended replica signals; and
summing means, coupled to the converter means and the voltage-to current converter means, for receiving a differential composite signal comprising the transmit signal, receiving the differential replica signal, and providing a differential difference signal representing a difference between the differential composite signal and the differential replica signal.

62. A communication circuit comprising:
K digital-to-analog converter means each for receiving a corresponding digital control signal and each for providing a corresponding transmit signal component, wherein K is at least two, and wherein at least one each of the K digital-to-analog converter means comprises
N current source means for providing current configured in a parallel arrangement, wherein N is at least two, and wherein each of the N current source means includes a respective means for inputting; and
M delay means for delaying, an mth one of the M delaying means including means for inputting in communication with an m−1th one of the M delay means, wherein M is equal to N−1, and wherein means for outputting of the mth one of the M delay means controls the inputting means of an m+1th one of the N current source means, and
wherein the corresponding transmit signal component comprises the sum of the outputs of the N current sources; and
wherein the corresponding transmit signal components of each of the K digital-to-analog converter means are combined to produce a J-level transmit signal, wherein J=K+1.

63. The communication circuit of claim 62, wherein the M delay means comprise at least one delay lock loop.

64. The communication circuit of claim 62, wherein the J-level transmit signal is a Class B signal.

65. The communication circuit of claim 62, wherein the communication circuit operates at up to gigabit speeds.

66. A communication circuit, comprising:
K digital-to-analog converter means each for receiving a corresponding digital control signal and each for providing a corresponding transmit signal component, wherein K is at least two, and
wherein at least one each of the K digital-to-analog converter means comprises:
N current source means for providing current configured in a parallel arrangement,
wherein N is at least two, and
wherein each of the N current source means includes a respective means for inputting, and
M delay means for delaying, an mth one of the M delaying means including means for inputting in communication with an m−1th one of the M delay means,
wherein M is equal to N−1, and
wherein means for outputting of the mth one of the M delay means is arranged in communication with the inputting means of an m+1th one of the N current source means,
wherein the corresponding transmit signal component comprises the sum of the outputs of the N current sources, and
wherein the corresponding transmit signal components of each of the K digital-to-analog converter means are combined to produce a J-level transmit signal wherein J=K+1; and
L digital-to-analog converter means each for receiving the corresponding digital control signal and each for providing a corresponding replica transmit signal component,
wherein L=K, and
wherein the corresponding replica transmit signal components of each of the L digital-to-analog converters are combined to produce a J-level replica transmit signal.

67. An Ethernet controller comprising:
digital-to-analog converter means for receiving a digital control signal, and for providing an analog control signal, the digital-to-analog converter means comprising
N current source means for providing current configured in a parallel arrangement,
wherein N is at least two, and
wherein each of the N current source means includes a respective means for inputting; and
M delay means for delaying, an mth one of the M delaying means including means for inputting in communication with an m−1th one of the M delay means,
wherein M is equal to N−1, and
wherein means for outputting of the mth one of the M delay means controls the inputting means of an m+1th one of the N current source means, and
wherein the analog control signal comprises the sum of the outputs of the N current source means; and
voltage-to-current converter means for providing a transmit signal based on the analog control signal.

68. The Ethernet controller of claim 67, wherein the M delay means comprise at least one delay lock loop.

69. The Ethernet controller of claim 67, wherein the transmit signal is a Class B signal.

70. The Ethernet controller of claim 67, further comprising:
filter means for receiving the analog control signal, and for providing a low-pass filtered analog control signal to the voltage-to-current converter means.

71. The Ethernet controller of claim 70, wherein the filter means comprises a single-pole filter.

72. The Ethernet controller of claim 67, wherein the voltage-to-current converter means provides a replica of the transmit signal.

73. The Ethernet controller of claim 67, wherein the voltage-to-current converter means comprises a voltage buffer.

74. The Ethernet controller of claim 67, wherein the Ethernet controller operates at up to gigabit speeds.

75. An Ethernet controller, comprising:
digital-to-analog converter means for receiving a digital control signal, and for providing an analog control signal, the digital-to-analog converter means comprising:
N current source means for providing current configured in a parallel arrangement, wherein N is at least two, and wherein each of the N current source means includes a respective means for inputting; and
M delay means for delaying, an mth one of the M delaying means including means for inputting in communication with an m−1th one of the M delay means, wherein M is equal to N−1, and wherein means for outputting of the mth one of the M delay means is arranged in communication with the inputting means of an m+1th one of the N current source means, and
wherein the analog control signal comprises the sum of the outputs of the N current source means;
voltage-to-current converter means for providing a transmit signal based on the analog control signal,
wherein the voltage-to-current converter means provides a replica of the transmit signal;
summing means for receiving a differential composite signal comprising the transmit signal, receiving a differential replica signal comprising the replica of the transmit signal, and providing a differential difference signal representing a difference between the differential composite signal and the differential replica signal;
replicating means for producing first and second single-ended replica signals which together substantially comprise the differential replica signal; and
converting means, which is coupled to the summing means and replicating means, for producing the differential replica signal from the first and second single-ended replica signals.

76. An Ethernet controller comprising:
K digital-to-analog converter means each for receiving a corresponding digital control signal and each for providing a corresponding analog control signal, wherein K is at least two;
K voltage-to-current converter means each for providing a corresponding bi-level transmit signal component in accordance with a respective one of the corresponding analog control signals; and
wherein the corresponding bi-level transmit signal components of each of the K voltage-to-current converter means are combined to produce a J-level transmit signal, wherein J=K+1.

77. The Ethernet controller of claim 76, wherein the J-level transmit signal is a Class B signal.

78. The Ethernet controller of claim 76, wherein each of the K digital-to-analog converter means comprises:
N current source means for providing current configured in a parallel arrangement, wherein N is at least two, and wherein each of the N current source means includes a respective means for inputting; and
M delay means for delaying, an mth one of the M delaying means including means for inputting in communication with an m−1th one of the M delay means, wherein M is equal to N−1, and wherein means for outputting of the mth one of the M delay means is arranged in communication with the inputting means of an m+1th one of the N current source means.

79. The Ethernet controller of claim 78, wherein the M delay means comprise at least one delay lock loop.

80. The Ethernet controller of claim 76, wherein the K voltage-to-current converter means provide a replica of the J-level transmit signal.

81. The Ethernet controller of claim 76, wherein each of the K voltage-to-current converter means comprises a voltage buffer.

82. The Ethernet controller of claim 76, wherein the Ethernet controller operates at up to gigabit speeds.

83. An Ethernet controller, comprising:
K digital-to-analog converter means each for receiving a corresponding digital control signal and each for providing a corresponding analog control signal, wherein K is at least two;
K voltage-to-current converter means each for providing a corresponding bi-level transmit signal component in accordance with a respective one of the corresponding analog control signals,
wherein the corresponding bi-level transmit signal components of each of the K voltage-to-current converter means are combined to produce a J-level transmit signal, wherein J=K+1,
wherein the K voltage-to-current converter means provide a replica of the J-level transmit signal,
wherein the replica of the transmit signal comprises first and second single-ended replica signals;
converter means for producing a differential replica signal from the first and second single-ended replica signals; and
summing means, coupled to the converter means and the voltage-to current converter means, for receiving a differential composite signal comprising the transmit signal, receiving the differential replica signal, and providing a differential difference signal representing a difference between the differential composite signal and the differential replica signal.

84. An Ethernet controller comprising:
K digital-to-analog converter means each for receiving a corresponding digital control signal and each for providing a corresponding transmit signal component, wherein K is at least two, and wherein at least one each of the K digital-to-analog converter means comprises
N current source means for providing current configured in a parallel arrangement, wherein N is at least two, and wherein each of the N current source means includes a respective means for inputting, and
M delay means for delaying, an mth one of the M delaying means including means for inputting in communication with an m−1th one of the M delay means, wherein M is equal to N−1, and wherein means for outputting of the mth one of the M delay means controls the inputting means of an m+1th one of the N current source means,
wherein the corresponding transmit signal component comprises the sum of the outputs of the N current sources; and
wherein the corresponding transmit signal components of each of the K digital-to-analog converter means are combined to produce a J-level transmit signal, wherein J=K+1.

85. The Ethernet controller of claim 84, wherein the M delay means comprise at least one delay lock loop.

86. The Ethernet controller of claim 84, wherein the J-level transmit signal is a Class B signal.

87. The Ethernet controller of claim 84, wherein the Ethernet controller operates at up to gigabit speeds.

88. An Ethernet controller, comprising:
K digital-to-analog converter means each for receiving a corresponding digital control signal and each for providing a corresponding transmit signal component, wherein K is at least two, and
wherein at least one each of the K digital-to-analog converter means comprises:
N current source means for providing current configured in a parallel arrangement,
wherein N is at least two, and
wherein each of the N current source means includes a respective means for inputting, and
M delay means for delaying, an mth one of the M delaying means including means for inputting in communication with an m−1th one of the M delay means,
wherein M is equal to N−1, and
wherein means for outputting of the mth one of the M delay means is arranged in communication with the inputting means of an m+1th one of the N current source means,
wherein the corresponding transmit signal component comprises the sum of the outputs of the N current sources, and
wherein the corresponding transmit signal components of each of the K digital-to-analog converter means are combined to produce a J-level transmit signal, wherein J=K+1; and
L digital-to-analog converter means each for receiving the corresponding digital control signal and each for providing a corresponding replica transmit signal component, wherein L=K, and
wherein the corresponding replica transmit signal components of each of the L digital-to-analog converters are combined to produce a J-level replica transmit signal.

89. A communication method comprising:
receiving a digital control signal;
providing an analog control signal in accordance with the digital control signal, comprising
supplying N sources of current, wherein N is at least two;
controlling the supply of current from each of the N sources of current;
delaying current from M of the N sources of current, where M is equal to N−1, and
wherein an output of an mth one of M delaying steps controls an m+1th one of the N sources of current; and summing the delayed currents,
wherein the analog control signal comprises the sum of the delayed currents; and
providing a transmit signal based on the analog control signal.

90. The communication method of claim 89, wherein the transmit signal is a Class B signal.

91. The communication method of claim 89, further comprising:
low-pass filtering the analog control signal; and
wherein the transmit signal is based on the low-pass filtered analog control signal.

92. The communication method of claim 91, wherein low-pass filtering the analog control signal comprises single-pole filtering the analog control signal.

93. The communication method of claim 89, further comprising providing a replica of the transmit signal.

94. The communication method of claim 89, wherein the communication method operates at up to gigabit speeds.

95. A communication method, comprising the steps of:
receiving a digital control signal;
providing an analog control signal in accordance with the digital control signal, comprising the steps of:
supplying N sources of current, wherein N is at least two;
controlling the supply of current from each of the N sources of current;
delaying current from M of the N sources of current, where M is equal to N−1; and
summing the delayed currents,
wherein the analog control signal comprises the sum of the delayed currents;
providing a transmit signal based on the analog control signal;
providing a replica of the transmit signal;
receiving a differential composite signal comprising the transmit signal;
receiving a differential replica signal comprising the replica of the transmit signal;
providing a differential difference signal representing a difference between the differential composite signal and the differential replica signal;
producing first and second single-ended replica signals which together substantially comprise the differential replica signal; and
producing the differential replica signal from the first and second single-ended replica signals.

96. A communication method comprising:
receiving K digital control signals, wherein K is at least two;
providing a corresponding analog control signal for each of the K digital control signals;
providing a corresponding bi-level transmit signal component in accordance with a respective one of the corresponding analog control signals; and
combining the corresponding bi-level transmit signal components to produce a J-level transmit signal, wherein J=K+1.

97. The communication method of claim 96, wherein the J-level transmit signal is a Class B signal.

98. The communication method of claim 96, wherein providing a corresponding analog control signal comprises:
supplying N sources of current, wherein N is at least two;
controlling the supply of current from each of the N sources of current;
delaying current from M of the N sources of current, where M is equal to N−1; and summing the delayed currents.

99. The communication method of claim 96, further comprising:
providing a replica of the J-level transmit signal.

100. The communication method of claim 96, wherein the communication method operates at up to gigabit speeds.

101. A communication method, comprising the steps of:
receiving K digital control signals, wherein K is at least two;
providing a corresponding analog control signal for each of the K digital control signals;
providing a corresponding bi-level transmit signal component in accordance with a respective one of the corresponding analog control signals;
combining the corresponding bi-level transmit signal components to produce a i-level transmit signal, wherein J=K+1;
providing a replica of the J-level transmit signal,
wherein the replica of the transmit signal comprises first and second single-ended replica signals;
producing a differential replica signal from the first and second single-ended replica signals; and
providing a differential difference signal representing a difference between the differential replica signal and a differential composite signal comprising the transmit signal.

102. A communication method comprising:
receiving K digital control signals, wherein K is at least two;
providing a corresponding transmit signal component for each of the K digital control signals, comprising
supplying N sources of current, wherein N is at least two,
controlling the supply of current from each of the N sources of current,
delaying current from M of the N sources of current, where M is equal to N−1, and
wherein an output of an mth one of M delaying steps controls an m+1th one of the N sources of current, and
summing the delayed currents,
wherein the corresponding transmit signal component comprises the sum of the delayed currents; and
combining the corresponding transmit signal components to produce a J-level transmit signal, wherein J=K+1.

103. The communication method of claim 102, wherein the J-level transmit signal is a Class B signal.

104. The communication method of claim 102, wherein the communication method operates at up to gigabit speeds.

105. A communication method, comprising the steps of:
receiving K digital control signals, wherein K is at least two;
providing a corresponding transmit signal component for each of the K digital control signals, comprising the steps of:
supplying N sources of current, wherein N is at least two;
controlling the supply of current from each of the N sources of current;
delaying current from M of the N sources of current, where M is equal to N−1; and
summing the delayed currents, wherein the corresponding transmit signal component comprises the
sum of the delayed currents;
combining the corresponding transmit signal components to produce a J-level transmit signal, wherein J=K+1;
receiving the corresponding digital control signals;
providing a corresponding replica transmit signal component for each of the corresponding digital control signals; and
combining the corresponding replica transmit signal components to produce a J-level replica transmit signal.

106. A communication circuit, comprising:
a plurality of sets of digital-to-analog converters (DACs),
wherein the plurality of sets of DACs are arranged in parallel,
wherein each DAC within a set of DACs is configured to receive a digital signal and to provide an output signal, and
wherein each DAC comprises:
N current sources arranged in parallel,
wherein N is at least two,
wherein each of the N current sources includes a respective control input, and
wherein the output signal provided by each DAC comprises a sum of outputs of the N current sources; and
M delay elements,
wherein an mth one of the M delay elements includes an input in communication with an m−1th one of the M delay elements,
wherein M is equal to N−1,
wherein an output of the mth one of the M delay elements controls the control input of an m+1th one of the N current sources,
wherein an input of a first one of the M delay elements receives the digital signal, and
wherein a sum of each output signal from a respective one of the plurality of sets of DACs forms a transmit signal.

107. The communication circuit of claim 106, comprising:
a summer for summing each output signal from the respective one of the plurality of sets of DACs.

108. The communication circuit of claim 106, wherein the plurality of sets of DACs comprises K sets of DACs, and
wherein the transmit signal comprises a J-level transmit signal,
wherein J=K+1.

109. The communication circuit of claim 106, wherein each of the N current sources of each DAC is arranged in a differential configuration.

110. The communication circuit of claim 106, wherein the M delay elements of each DAC comprise at least one delay lock loop.

111. The communication circuit of claim 106, wherein the transmit signal comprises a Class B signal.

112. The communication circuit of claim 106, wherein a first set of the plurality of sets of DACs is configured to produce a first polarity of a differential composite signal comprising transmit signal components output by the DACs of the first set, and configured to produce a first polarity of a differential replica signal comprising replicas of the transmit signal components output by the DACs of the first set.

113. The communication circuit of claim 112, wherein a second set of the plurality of sets of DACs is configured to produce a second polarity of the differential composite signal comprising transmit signal components output by the DACs of the second set, and configured to produce a second polarity of the differential replica signal comprising replicas of the transmit signal components output by the DACs of the second set.

114. The communication circuit of claim 113, wherein a differential difference signal is produced comprising a difference between the differential composite signal and the differential replica signal.

115. The communication circuit of claim 114, wherein the differential difference signal comprises a receive signal.

116. The communication circuit of claim 106, wherein the communication circuit operates at up to gigabit speeds.

117. A communication circuit, comprising:
a plurality of sets of digital-to-analog converter (DAC) means,
wherein the plurality of sets of DAC means are arranged in parallel,
wherein each DAC means within a set of DAC means is configured to receive a digital signal and to provide an output signal, and
wherein each DAC means comprises:
N current source means arranged in parallel,
wherein N is at least two,
wherein each of the N current source means includes a respective means for inputting, and
wherein the output signal provided by each DAC means comprises a sum of outputs of the N current source means; and
M delay means,
wherein an mth one of the M delay means includes a means for inputting in communication with an m−1th one of the M delay means,
wherein M is equal to N−1,
wherein means for outputting of the mth one of the M delay means controls the inputting means of an m+1th one of the N current source means,
wherein the inputting means of a first one of the M delay elements receives the digital signal, and
wherein a sum of each output signal from a respective one of the plurality of sets of DAC means forms a transmit signal.

118. The communication circuit of claim 117, comprising:
means for summing each output signal from the respective one of the plurality of sets of DAC means.

119. The communication circuit of claim 117, wherein the plurality of sets of DAC means comprises K sets of DAC means, and
wherein the transmit signal comprises a J-level transmit signal,
wherein J=K+1.

120. The communication circuit of claim 117, wherein each of the N current source means of each DAC means is arranged in a differential configuration.

121. The communication circuit of claim 117, wherein the M delay means of each DAC means comprise at least one delay lock loop means.

122. The communication circuit of claim 117, wherein the transmit signal comprises a Class B signal.

123. The communication circuit of claim 117, wherein a first set of the plurality of sets of DAC means is configured to produce a first polarity of a differential composite signal comprising transmit signal components output by the DAC means of the first set, and configured to produce a first polarity of a differential replica signal comprising replicas of the transmit signal components output by the DAC means of the first set.

124. The communication circuit of claim 123, wherein a second set of the plurality of sets of DAC means is configured to produce a second polarity of the differential composite signal comprising transmit signal components output by the DAC means of the second set, and configured to produce a second polarity of the differential replica signal comprising replicas of the transmit signal components output by the DAC means of the second set.

125. The communication circuit of claim 124, wherein a differential difference signal is produced comprising a difference between the differential composite signal and the differential replica signal.

126. The communication circuit of claim 125, wherein the differential difference signal comprises a receive signal.

127. The communication circuit of claim 117, wherein the communication circuit operates at up to gigabit speeds.

128. An Ethernet controller, comprising:
a plurality of sets of transceivers,
  wherein the plurality of sets of transceivers are arranged in parallel,
  wherein each transceiver within a set of transceivers is configured to receive a digital signal and to provide an output signal, and
  wherein each transceiver comprises:
    N current sources arranged in parallel,
      wherein N is at least two,
      wherein each of the N current sources includes a respective control input, and
      wherein the output signal provided by each transceiver comprises a sum of outputs of the N current sources; and
    M delay elements,
      wherein an mth one of the M delay elements includes an input in communication with an m−1th one of the M delay elements,
      wherein M is equal to N−1,
      wherein an output of the mth one of the M delay elements controls the control input of an m+1th one of the N current sources,
      wherein an input of a first one of the M delay elements receives the digital signal, and
  wherein a sum of each output signal from a respective one of the plurality of sets of transceivers forms a transmit signal.

129. The Ethernet controller of claim 128, comprising:
a summer for summing each output signal from the respective one of the plurality of sets of transceivers.

130. The Ethernet controller of claim 128, wherein the plurality of sets of transceivers comprises K sets of transceivers, and
  wherein the transmit signal comprises a J-level transmit signal,
  wherein J=K+1.

131. The Ethernet controller of claim 128, wherein each of the N current sources of each transceiver is arranged in a differential configuration.

132. The Ethernet controller of claim 128, wherein the M delay elements of each transceiver comprise at least one delay lock loop.

133. The Ethernet controller of claim 128, wherein the transmit signal comprises a Class B signal.

134. The Ethernet controller of claim 128, wherein a first set of the plurality of sets of transceivers is configured to produce a first polarity of a differential composite signal comprising transmit signal components output by the transceivers of the first set, and configured to produce a first polarity of a differential replica signal comprising replicas of the transmit signal components output by the transceivers of the first set.

135. The Ethernet controller of claim 134, wherein a second set of the plurality of sets of transceivers is configured to produce a second polarity of the differential composite signal comprising transmit signal components output by the transceivers of the second set, and configured to produce a second polarity of the differential replica signal comprising replicas of the transmit signal components output by the transceivers of the second set.

136. The Ethernet controller of claim 135, wherein a differential difference signal is produced comprising a difference between the differential composite signal and the differential replica signal.

137. The Ethernet controller of claim 136, wherein the differential difference signal comprises a receive signal.

138. The Ethernet controller of claim 128, wherein the Ethernet controller operates at up to gigabit speeds.

139. An Ethernet controller, comprising:
a plurality of sets of transceiver means,
  wherein the plurality of sets of transceiver means are arranged in parallel,
  wherein each transceiver means within a set of transceiver means is configured to receive a digital signal and to provide an output signal, and
  wherein each transceiver means comprises:
    N current source means arranged in parallel,
      wherein N is at least two,
      wherein each of the N current source means includes a respective means for inputting, and
      wherein the output signal provided by each transceiver means comprises a sum of outputs of the N current source means; and
    M delay means,
      wherein an mth one of the M delay means includes a means for inputting in communication with an m−1th one of the M delay means,
      wherein M is equal to N−1,
      wherein means for outputting of the mth one of the M delay means controls the inputting means of an m+1th one of the N current source means,
      wherein the inputting means of a first one of the M delay elements receives the digital signal, and
  wherein a sum of each output signal from a respective one of the plurality of sets of transceiver means forms a transmit signal.

140. The Ethernet controller of claim 139, comprising:
means for summing each output signal from the respective one of the plurality of sets of transceiver means.

141. The Ethernet controller of claim 139, wherein the plurality of sets of transceiver means comprises K sets of transceiver means, and
  wherein the transmit signal comprises a J-level transmit signal,
  wherein J=K+1.

142. The Ethernet controller of claim 139, wherein each of the N current source means of each transceiver means is arranged in a differential configuration.

143. The Ethernet controller of claim 139, wherein the M delay means of each transceiver means comprise at least one delay lock loop means.

144. The Ethernet controller of claim 139, wherein the transmit signal comprises a Class B signal.

145. The Ethernet controller of claim 139, wherein a first set of the plurality of sets of transceiver means is configured to produce a first polarity of a differential composite signal comprising transmit signal components output by the transceiver means of the first set, and configured to produce a first polarity of a differential replica signal comprising replicas of the transmit signal components output by the transceiver means of the first set.

146. The Ethernet controller of claim 145, wherein a second set of the plurality of sets of transceiver means is configured to produce a second polarity of the differential composite signal comprising transmit signal components output by the transceiver means of the second set, and configured to produce a second polarity of the differential replica signal comprising replicas of the transmit signal components output by the transceiver means of the second set.

147. The Ethernet controller of claim 146, wherein a differential difference signal is produced comprising a difference between the differential composite signal and the differential replica signal.

148. The Ethernet controller of claim 147, wherein the differential difference signal comprises a receive signal.

149. The Ethernet controller of claim 139, wherein the Ethernet controller operates at up to gigabit speeds.

150. A communication method, comprising the steps of:
 a.) receiving K digital signals, wherein K is at least two;
 b.) providing K corresponding transmit signal components in accordance with each of the K digital signals, wherein for each transmit signal component, step (b) comprises the steps of:
  b1.) supplying N sources of current,
   wherein N is at least two;
  b2.) controlling the supply of current from each of the N sources of current;
  b3.) delaying current from M of the N sources of current,
   wherein M is equal to N−1, and
   wherein an output of an mth one of M delaying steps controls an m+1th one of the N sources of current; and
  b4.) summing the delayed currents; and
 c.) combining the K corresponding transmit signal components to produce a J-level transmit signal.

151. The method of claim 150, wherein J=K+1.

152. The method of claim 150, wherein the transmit signal comprises a Class B signal.

153. The method of claim 150, comprising the steps of:
 receiving a first polarity of a differential composite signal comprising transmit signal components output by a first set of the plurality of parallel sets; and
 receiving a first polarity of a differential replica signal comprising replicas of the transmit signal components output the first set of the plurality of parallel sets.

154. The method of claim 153, comprising the steps of:
 receiving a second polarity of the differential composite signal comprising transmit signal components output by a second set of the plurality of parallel sets; and
 receiving a second polarity of the differential replica signal comprising replicas of the transmit signal components output by the second set of the plurality of parallel sets.

155. The method of claim 154, comprising the step of:
 producing a differential difference signal comprising a difference between the differential composite signal and the differential replica signal.

156. The method of claim 155, wherein the differential difference signal comprises a receive signal.

* * * * *

UNITED STATES PATENT AND TRADEMARK OFFICE
CERTIFICATE OF CORRECTION

PATENT NO. : 6,844,837 B1 Page 1 of 1
APPLICATION NO. : 10/191924
DATED : January 18, 2005
INVENTOR(S) : Sehat Sutardja et al.

It is certified that error appears in the above-identified patent and that said Letters Patent is hereby corrected as shown below:

On Title Page, should read, item (63) under "Related US. Application Data," as follows:

Continuation-in-part of application No. 09/920,241, filed on Aug. 1, 2001, [[and]] a continuation-in-part of application No. 09/737,474, filed on Dec. 18, 2000, now Pat. No. 6,462,688, a continuation-in-part of application No. 09/737,743, filed on Dec. 18, 2000, and a continuation-in-part of application No. 09/629,092, filed on Jul. 31, 2000.

On Title Page, should read, add item (60) after item (63) under "Related U.S Application Data," as follows:

(60) Provisional application No. 60/206,409, filed on May 23, 2000, and provisional application No. 60/211,571, filed on Jun. 15, 2000.

Column 1, line 5, should read as follows:

This application is a continuation-in-part of U.S. Non-Provisional Patent Application Serial No. 09/920,241 entitled "Apparatus And Method For Converting Single-Ended Signals To A Differential Signal, And A Transceiver Employing Same," filed 8/1/2001; and U.S. Non-Provisional Patent Application Serial No. 09/737,474 entitled "Direct Drive Programmable Class A and B High Speed Power Digital-to-Analog Converter," filed 12/18/2000 (now U.S. Patent No. 6,462,688), the disclosures thereof incorporated by reference herein in their entirety. This application is also a continuation-in-part of U.S. Non-Provisional Patent Application Serial No. 09/737,743, filed 12/18/2000, which claims priority under 35 U.S.C. 119(e) to U.S. Provisional Application Serial No. 60/206,409, filed 05/23/2000, and to U.S. Provisional Application Serial No. 60/211,571, filed 06/15/2000. This application is also a continuation-in-part of U.S. Patent Application Serial No. 09/629,092, filed 07/31/2000.

Signed and Sealed this

Fourth Day of July, 2006

JON W. DUDAS
*Director of the United States Patent and Trademark Office*